US006201234B1

(12) United States Patent
Chow et al.

(10) Patent No.: US 6,201,234 B1
(45) Date of Patent: Mar. 13, 2001

(54) OPTICAL OPERATIONAL AMPLIFIER

(75) Inventors: Alan Y Chow, 191 Palamino Pl., Wheaton, IL (US) 60187; Vincent Y. Chow, Hanover Park, IL (US)

(73) Assignee: Alan Y Chow, Wheaton, IL (US)

( * ) Notice: Subject to any disclaimer, the term of this patent is extended or adjusted under 35 U.S.C. 154(b) by 0 days.

(21) Appl. No.: 09/088,579

(22) Filed: Jun. 2, 1998

Related U.S. Application Data

(63) Continuation-in-part of application No. 08/755,729, filed on Nov. 25, 1996, now Pat. No. 5,837,995.

(51) Int. Cl.[7] ................................................. H01J 40/14
(52) U.S. Cl. ........................... 250/214 LS; 250/214.1; 250/551; 250/214 A
(58) Field of Search ........................ 250/214.1, 214 A, 250/214 LS, 214 R, 551; 327/514, 515; 257/80, 82, 84, 431, 432, 433, 458, 461

(56) References Cited

U.S. PATENT DOCUMENTS

| 4,001,867 | 1/1977 | Kravitz et al. |
|---|---|---|
| 4,873,448 | 10/1989 | Shirai . |
| 5,024,223 * | 6/1991 | Chow .............................. 128/419 R |
| 5,130,582 | 7/1992 | Phillips, Jr. . |
| 5,130,776 | 7/1992 | Popovic et al. . |
| 5,223,728 | 6/1993 | Gempe . |
| 5,256,882 | 10/1993 | Miyasaka . |
| 5,338,991 | 8/1994 | Lu . |
| 5,351,309 | 9/1994 | Lee et al. . |
| 5,397,350 * | 3/1995 | Chow et al. .............................. 623/4 |
| 5,491,349 | 2/1996 | Komoto et al. . |
| 5,556,423 * | 9/1996 | Chow et al. ........................... 607/54 |
| 5,717,201 | 2/1998 | Lin et al. . |
| 5,837,995 * | 11/1998 | Chow et al. .................. 250/214 LS |

FOREIGN PATENT DOCUMENTS

| 0084621 | 11/1982 | (EP) . |
|---|---|---|
| 0501904 | 2/1992 | (EP) . |
| 9639221 | 12/1996 | (EP) . |

OTHER PUBLICATIONS

The Vertical Integration of Crystalline NMOS and Amorphous Orientational Edge Detector, Heng–Chih Lin, Wen–Jyh Sah, and Si–Chen Lee (Dec. 12, 1992) vol. 39, No. 12, pp. 2810–2812.

* cited by examiner

Primary Examiner—John R. Lee
(74) Attorney, Agent, or Firm—Mayer, Brown & Platt

(57) ABSTRACT

An optical operational amplifier is disclosed. The operational amplifier has a first photodiode with an anode and a cathode. A second photodiode with an anode coupled to the cathode of the first photodiode, and an anode coupled to the cathode of the first photodiode to form an output terminal. A resistor is coupled in parallel with the first and second photodiodes. The inputs to the operational amplifier are light sources which generate different currents in the first and second photodiodes. The output voltage from the output terminal is a function of the difference in currents across the first and second photodiode. The output voltage is amplified in proportion to the value of the resistor. The basic optical operational amplifier configuration may be used in a variety of useful circuits. One example is the use of the amplifier in a position sensing device which determines position of a light beam by the output of photodiode sensing elements. A second example is the use of the operational amplifier in a retinal stimulator device. The output waveform of the operational amplifier may be shaped by the resistor and added capacitative elements to be more compatible with retina cells.

21 Claims, 12 Drawing Sheets

OPTICAL OPERATIONAL AMPLIFIER

RELATED APPLICATIONS

This application is a continuation-in-part from application Ser. No. 08/755,729 titled "Wavelength-Controllable Voltage-Phase Photodiode Optoelectronic Switch ('Opsistor')" filed on Nov. 25, 1996 now U.S. Pat. No. 5,837,995, to the same inventors.

FIELD OF THE INVENTION

This invention relates in general to an operational amplifier based on a voltage-phase optoelectronic switch (referred to as an "opsistor"). More specifically, this invention relates to an operational amplifier which has a pair of current based sensors such as photodiodes arranged in opposite orientation and an impedance device in parallel with the sensors to control amplifier gain.

BACKGROUND OF THE INVENTION

A well known building block for digital and analog electronic circuits is the operational amplifier or differential amplifier. A basic operational amplifier configuration may be used to make comparisons between the voltage level of two input signals. An operational amplifier may have multiple uses in different circuit configurations such as amplifying an input signal to a desired level using different circuit components, performing mathematical functions such as addition or multiplication, and signal modulation.

However, present operational amplifiers have several problems. Present operational amplifiers are analog circuits having components which add electrical noise to the basic sensor signal and are sensitive to signal saturation. Each of the two input sensor signals on a conventional operational amplifier must first be preamplified before they can be differentially processed. This preamplification is commonly done using transimpedance amplifiers that "sample" the sensor current with a summing junction node. The output of the transimpedance amplifier produces a voltage which forces a current (via a feedback resistor) back into the node to offset the current produced by the sensor. The resultant output voltage is therefore a "transform" of the sensor current. Use of the transimpedance amplifier functions well except the sensor current is easily contaminated by amplifier noise.

Signal and amplifier noise may be reduced by the use of optical switch sensors which are impervious to stray electronic noise. Previously, optosensors included a single photodiode, phototransistor, photodarlington, and the like are two-state, current-driven devices that have an "on" or "off" current state. For applications such as optocouplers and optoisolators, these devices responded to an "on" or "off" pre-couple signal with a corresponding "on" or "off" post-couple current signal. The inherent speed of such devices was limited by the rate at which they could switch their currents "on" and "off," the limiting factor often being the passive return-to-ground period. Also for an "on" current state to be recognized, the current had to be at a significantly greater amplitude than background noise. However, the higher the signal current that was needed to generate this recognition, the longer time required by the switch device to generate that current level, and an even longer period was required before the switch device would return to the ground level. These characteristics of previous optoelectronic switches resulted in relatively slow switching speeds of usually less than 1 MHZ for a standard photodiode, and even slower speeds for more complicated devices such as phototransistors.

An improved faster optoelectronic switch, termed an opsistor, has been proposed in our co-pending application, Ser. No. 08/755,729, now U.S. Pat. No. 5,837,995, to the same inventors. However, although such optoelectronic switches can be designed to respond with faster switch frequencies by using special circuitry, the additional components of such circuitry increase the complexity and cost of such devices. Further, the transmitter and receiving elements of fast optoelectronic switches have to be in close proximity, usually in a single package, for efficient function and to minimize extraneous light interference.

Ideally, the sensor current should be sensed by FET high impedance probes that do not contaminate the signal purity. The sensor current itself must flow in a circuit free of contamination currents. To achieve this, the sensor current has to be confined in an "electrical loop" where it can flow with high purity. This property, however, has no utility if the sensor current magnitude cannot be "read." Therefore, this ideal circuit must also produce a detectable voltage change proportional to its sensor current. In addition, the operating point DC bias across this sensor must be at a fixed voltage (usually 0 volts) to achieve sensor linearity. The transimpedance amplifier satisfies some of these conditions but suffers from the fact the feedback resistor must be in contact with the actual sensor input, thus injecting amplifier noise that is also amplified along with the sensor signal. These requirements of a closed loop current path and a pure input signal cannot be simultaneously met with teachings from current art.

Thus, there is a need for an operational amplifier which may minimize input signal noise. There is a further need for a simple optical operational amplifier which may use presently known circuit components. There is also a need for a simple optical operational amplifier which allows an adjustment of output gain. There is a need for an optical operational amplifier which includes passive components to shape an input waveform.

SUMMARY OF THE INVENTION

One aspect of the present invention is an electrical switch which has a first current producing sensor having a source current terminal and a sink current terminal. A first sensor input is operatively coupled to the first current producing sensor and emits an input signal. A second current producing sensor has a source current terminal coupled to the sink current terminal of the first current producing sensor and a sink current terminal coupled to the source current terminal of the first current producing sensor. A second sensor input is operatively coupled to the second current producing sensor and emits an input signal. The voltage phase of the first current sensor and the second current sensor is proportional to the sensor input levels received by the first and second current producing sensors.

The invention is also embodied in an optoelectronic operational amplifier having a first photodiode with an anode and a cathode. A second photodiode has an anode coupled to the cathode of the first photodiode and an anode coupled to the cathode of the first photodiode, to form an output terminal. A resistor is coupled in parallel with the first and second photodiodes.

The invention also includes an optical ruler system for determining the position of an object. The object has a light source emitting a light beam having an impact area with a specific length. A first photodiode element having a photo sensitive surface, with a length shorter than that of the impact are of the light beam, is provided. A second photodiode element is coupled with the first photodiode element. The second photodiode element has a photo sensitive surface with a length shorter than that of the impact area of the light beam. The impact area of the light beam impacts the photo sensitive surfaces of the first and second photodiode element depending on the position of the object. A processing circuit reads an output signal from the first and second photodiode elements and determines the position of the object based on the value of the combined signal from the first and second photodiode elements and a known position.

The invention is also embodied in a method for determining the position of an object. The object has a light source emitting a light beam having an impact area with a specific length. A position measurement sensor is placed in the plane of the light beam. The position measurement sensor has a first photodiode element having a photo sensitive surface with a length shorter than that of the impact area of the light beam and a second photodiode element coupled with the first photodiode element. The second photodiode element has a photo sensitive surface having a length shorter than that of the impact area of the light beam. The impact area of the light beam impacts the photo sensitive surfaces of the first and second photodiode element depending on the position of the object. A known position is determined. The position of the object is determined by reading the combined output signal from the first and second photodiode element and determining the position of the object based on the value of the combined signal from the first and second photodiode elements and the known position.

A further embodiment of the present invention is a retina stimulation device for implantation between the layers of an inner and outer retina to provide electrical signals representative of incident light to a cell layer of the inner retina. The retina stimulation device has a sensor array having at least one pixel with a surface exposed to the incident light. The pixel converts the incident light into an electronic waveform representative of the incident light. A waveform circuit is coupled to the pixel and has an impedance element which shapes the waveform with rise time, fall time and voltametric balance to induce hyperpolarization and depolarization effects into the cell layer of the inner retina. A contact is coupled to the waveform circuit and the cell layer of the inner retina to allow transmission of the shaped waveform.

Another embodiment of the present invention is an optoelectronic retina stimulation device for implantation between the layers of the inner and outer retina to provide electrical signals representative of incident light to a cell layer of the inner retina. The retina stimulation device has a sensor array having at least one pixel. The pixel has a first photodiode with an anode and a cathode being exposed to the incident light. A second photodiode has an anode coupled to the cathode of the first photodiode, and an anode coupled to the cathode of the first photodiode to form an output terminal. A resistor is coupled in parallel with the first and second photodiodes. A capacitor is also coupled in parallel with the first and second photodiodes. A first electrode is coupled to the anode of the first photodiode and the cathode of the second photodiode and the electrode is in contact with a cell layer of the inner retina. A second electrode is coupled to the cathode of the first photodiode and the cathode of the second photodiode and the second electrode is in contact with the cell layer of the inner retina.

It is to be understood that both the foregoing general description and the following detailed description are not limiting but are intended to provide further explanation of the invention claimed. The accompanying drawings, which are incorporated in and constitute part of this specification, are included to illustrate and provide a further understanding of the method and system of the invention. Together with the description, the drawings serve to explain the principles of the invention.

DETAILED DESCRIPTION OF THE PREFERRED EMBODIMENTS

Figure 1:
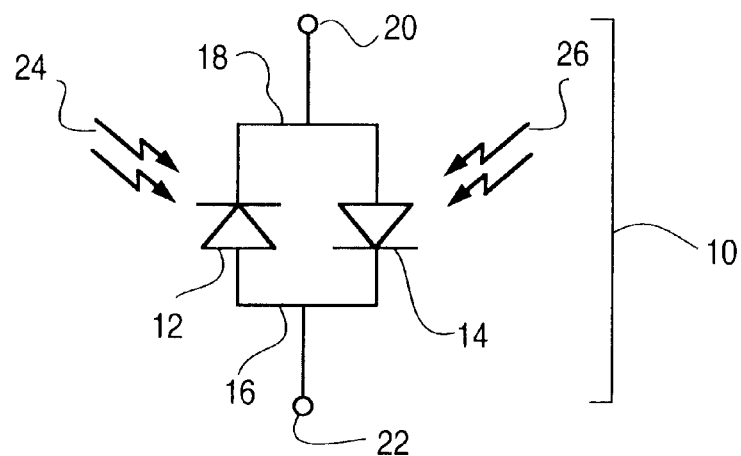
FIG. 1 is a schematic diagram of the basic opsistor according to the first preferred embodiment of the present invention.

An opsistor 10 shown in FIG. 1 comprises two PIN photodiodes, a first photodiode 12 and a second photodiode 14 electrically connected in an inverse parallel manner such that the anode of the first photodiode 12 is electrically connected to the cathode of the second photodiode 14 via a first common conductor 16, and the cathode of the first photodiode 12 is connected to the anode of the second photodiode 14 via a second common conductor 18. The voltage phase developed by the opsistor 10 is measured from a first output terminal 20 and a second output terminal 22. A first transmitter signal light source 24 to the first photodiode 12 is represented by the arrows 24. A second transmitter signal light source 26 to the second photodiode 14 is represented by the arrows. The voltage-phase developed at the output terminals 20 and 22 is determined by which of the two photodiodes 12 and 14 produces a higher voltage which is dependent on the relative intensity of illumination they receive from the transmitter signal light sources 24 and 26. For example if the first photodiode 12 produces a higher voltage than the second photodiode 14, then the voltage phase measured from the first output terminal 20 will be negative and the voltage-phase from the second output terminal 22 will be positive. On the other hand, if the voltage from the second photodiode 14 is greater than the voltage from the first photodiode 12, then the voltage-phase measured from the first output terminal 20 will be positive and the voltage-phase measured from the second output terminal 22 will be negative. Thus if the two photodiodes 12 and 14 are similar or identical as possible, the voltage-phase from the output terminals 20 and 22 is controlled by relative intensity of illumination of the two photodiodes 12 and 14, i.e. changes in the relative illumination from transmitter signal light sources 24 and 26 to the two photodiodes 12 and 14.

Figure 2:
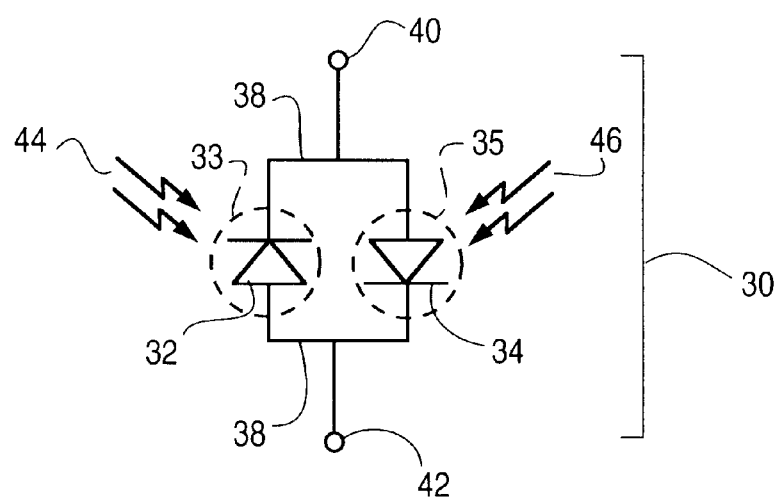
FIG. 2 is a schematic diagram of the OPS-F according to the second preferred embodiment of the present invention.

A preferred embodiment of the present invention is shown in FIG. 2 which is a bandwidth-filtered opsistor ("the OPS-F") 30. The OPS-F 30 comprises two PIN photodiodes 32 and 34, the first photodiode 32 filtered with a first bandwidth-portion filter 33, and the second photodiode 34 filtered with a second bandwidth-portion filter 35. The first and second photodiodes 32 and 34 are electrically connected in an inverse parallel manner such that the anode of the first photodiode 32 is electrically connected to the cathode of the second photodiode 34 via a first common conductor 36, and the cathode of the first photodiode 32 is connected to the anode of the second photodiode 34 via a second common conductor 38. The first bandwidth-portion filter 33 passes a different bandwidth of transmitter signal light than the second wavelength-portion filter 35. The voltage-phase developed by the OPS-F 30 is measured from a first output terminal 40 and a second output terminal 42. The first bandwidth-portion signal light source ("WPSLS-1") 44 to the first photodiode 32 is represented by the arrows from WPSLS-1 44 to photodiode 32. The second bandwidth-portion signal light source ("WPSLS-2") 46 to the second photodiode 34 is represented by the arrows from WPSLS 46 to the photodiode 34. Because each wavelength-portion filtered photodiode 32 and 34 responds only to its own specific bandwidth of light, WPSLS-1 44 for photodiode 32 and WPSLS-2 46 for photodiode 34, input signals can be provided from a distant location without cross-talk interference. The term "light" is not restricted to visible light, but also include wavelengths from the far ultraviolet to the far infrared.

The voltage-phase developed at the output terminals 40 and 42 is determined by which of the two photodiodes 32 and 34 produces a higher voltage which in turn is dependent on the relative illumination they receive from the transmitter signal light sources, WPSLS-1 44 and WPSLS-2 46. For example in FIG. 2, if the first photodiode 32 receives a greater illumination from WPSLS-1 44 and thus produces a higher voltage than the second photodiode 34 being illuminated by WPSLS-2 46, then the voltage-phase measured from the first output terminal 40 will be negative and the voltage-phase from the second output terminal 42 will be positive. On the other hand, if the second photodiode 34 receives a greater illumination from WPSLS-2 46 and thus produces a higher voltage than the first photodiode 32 receiving illumination from WPSLS-1 44, then the voltage-phase measured from the first output terminal 40 will be positive and the voltage-phase measured from the second output terminal 42 will be negative. Thus if the two photodiodes 32 and 34 are similar or identical, the voltage-phase from the output terminals 40 and 42 is controlled by relative illumination and changes in the relative illumination of WPSLS-1 44 and WPSLS-2 46 to the two photodiodes 32 and 34.

Figure 3:
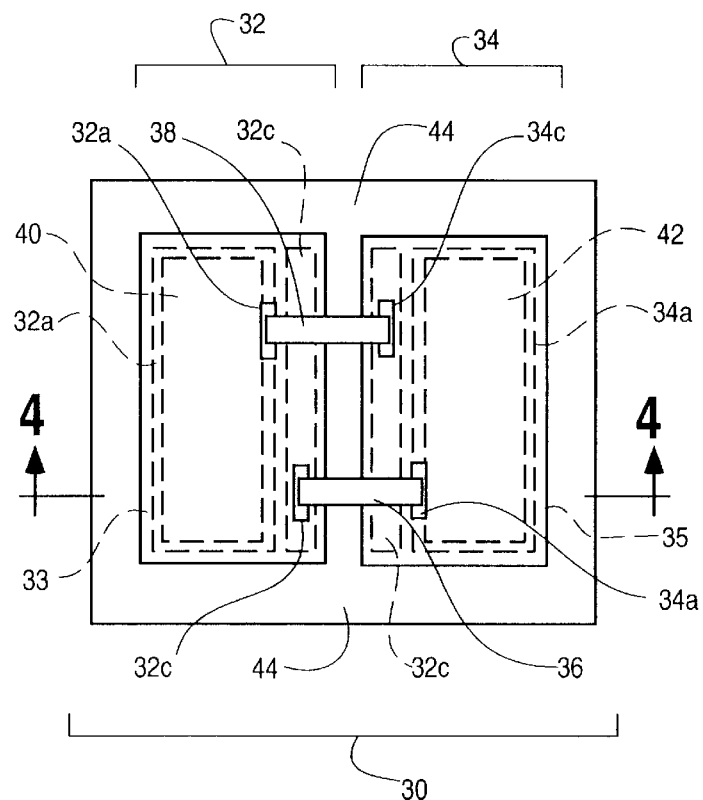
FIG. 3 is a plan view of the OPS-F constructed as a monolithic integrated circuit according to the second preferred embodiment of the present invention.
Figure 4:
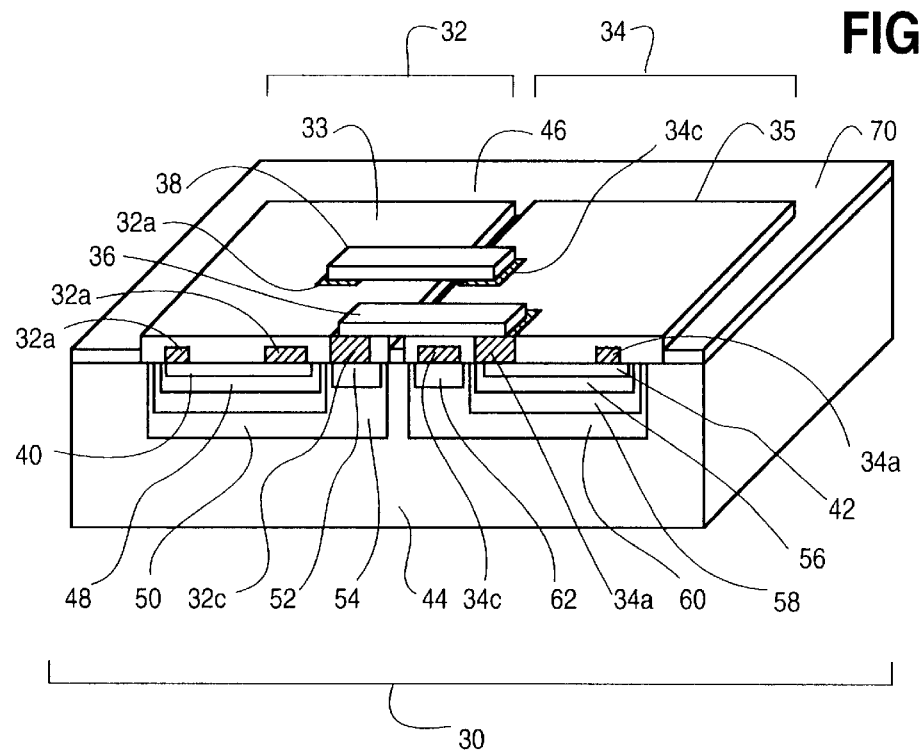
FIG. 4 is a three-dimensional section view of the OPS-F constructed as a monolithic integrated circuit according to the second preferred embodiment of the present invention taken along the plane of line IV—IV of FIG. 3.

Preferably, as shown in FIGS. 3–4, the OPS-F device 30, is constructed as a monolithic integrated circuit. The OPS-F 30 consists of two PIN photodiodes 32 and 34, the first photodiode 32 filtered with the first bandwidth-portion filter 33, and the second photodiode 34 filtered with the second bandwidth-portion filter 35, electrically connected in an inverse parallel manner such that the cathode 32c of the first photodiode 32 is electrically connected to the anode 34a of the second photodiode 34 via a first common conductor 36, and the anode 32a of the first photodiode 32 is connected to the cathode 34c of the second photodiode 34 via a second common conductor 38. The first bandwidth-portion filter 33 passes a different bandwidth of stimulating light than the second bandwidth-portion filter 35. The voltage-phase developed by the OPS-F 30 is measured from the first common conductor 36 and the second common conductor 38 which are also the output terminals. The voltage-phase developed at the common conductors 36 and 38 is determined by which of the two photodiodes 32 and 34 produces a higher voltage which is dependent on the relative illumination which they receive from their respective signal light sources.

For example if the illumination of the entire OPS-F 30 contains a greater proportion of bandwidths that can stimulate the first photodiode 32 than can stimulate the second photodiode 34, then a higher voltage will be developed by the first photodiode 32 than the second photodiode 34, and the voltage-phase measured from the first common conductor 36 will be negative and the voltage-phase measured from the second common conductor 38 will be positive. On the other hand, if the illumination to the entire OPS-F 30 contains a greater proportion of bandwidths that can stimulate the second photodiode 34 than can stimulate the first photodiode 32, then a higher voltage will be developed by the second photodiode 34 than the first photodiode 32, and the voltage-phase measured from the first common conductor 36 will be positive and the voltage-phase measured from the second common conductor 38 will be negative.

In the preferred embodiment of the OPS-F 30 shown in FIGS. 3–4, the P+surface 40 of the first photodiode 32 has its anode 32a deposited around the entire edge of the P+region 40, and the cathode 32c of the first photodiode 32 is deposited completely over a large area of the N+region 52 under the cathode 32c. Similarly in the preferred embodiment of the OPS-F 30 shown in FIG. 3, the P+surface 42 of the second photodiode 34 has its anode 34a deposited around the entire edge of its P+region 42, and the cathode 34c of the second photodiode 34 is deposited completely over a large area of the N+region 62 under the cathode 34c. The starting P-type silicon substrate 44 is shown surrounding the two photodiodes 32 and 34. Although, the starting monolithic silicon substrate 44 for the illustrated preferred embodiment of the OPS-F device 30 of the present invention is undoped silicon, those skilled in the art will recognize that P-type or N-type silicon may also be use as a starting monolithic silicon substrate by altering the fabrication of the OPS-F's photodiodes.

As illustrated in FIG. 4, the construction of the OPS-F 30 follows standard semiconductor fabrication processes. PIN photodiodes 32 and 34 each with a distinct intrinsic layer 50 and 58 are used in this embodiment because of their higher switching speeds. A first heavily doped N−region 54 and a second heavily doped N−region 60 are fabricated in close proximity to each other in the starting undoped substrate 44. A first N+region 52, and a second N+region 62 are then fabricated in the first N−region 54 and the second N−region 60 respectively. A first heavily doped P−region 48 and a second heavily doped P−region 56 are then fabricated in the first N−region 54 and second N−region 60 respectively. A first intrinsic layer 50 then forms at the junction of the P−region 48 and the N−region 54. A second intrinsic layer 58 then forms at the junction of the P−region 56 and the N−region 60. A first P+region 40 is then fabricated in the first P−region 48, and a second P+-region 42 is then fabricated in the second P−region 56. A first metallic anode 32a is deposited on the first P+region 40 on its perimeter to permit a large area of electrical contact and a second metallic anode 34a is deposited on the second P+region 42 on its perimeter to permit a large area of electrical contact. A first metallic cathode 32c is deposited on the entirety of the first N+region 52 to permit a large area of electrical contact. A second metallic cathode 34c is deposited on the entirety of the second N+region 62 to permit a large area of electrical contact. The first wavelength-portion filter 33, which in the preferred embodiment is a multilayer dielectric layer, is deposited on the first photodiode 32. The second wavelength-portion filter 35, which in the preferred embodiment is a multilayer dielectric filter, is deposited on the second photodiode 34.

Filter layers 33 and 35 each pass a different bandwidth of light within the spectrum from 450 nm to 1150 nm, the spectral response of the silicon photodiodes. In the preferred embodiment for example, the first filter layer 33 has a bandwidth pass from 600 nm to 850 nm, and the second filter layer 35 has a bandwidth pass from 850 nm to 1100 nm. Those skilled in the art however will recognize that other bandwidths, both longer and shorter, are also useful.

A silicon dioxide insulating layer 70 is fabricated on the areas of the OPS-F 30 not covered by the filter layers 33 and 35. Openings are etched in filter layers 33 and 35 to expose the anodes 32a and 34a and the cathodes 32c and 34c. A first common conductor 36 is then deposited to connect the first cathode 32c to the second anode 34a, and a second common conductor 38 is deposited to connect the first anode 32a to the second cathode 34c. The common conductors 36 and 38 also serve as the output terminals 42 and 40 illustrated in FIG. 2.

Figure 5:
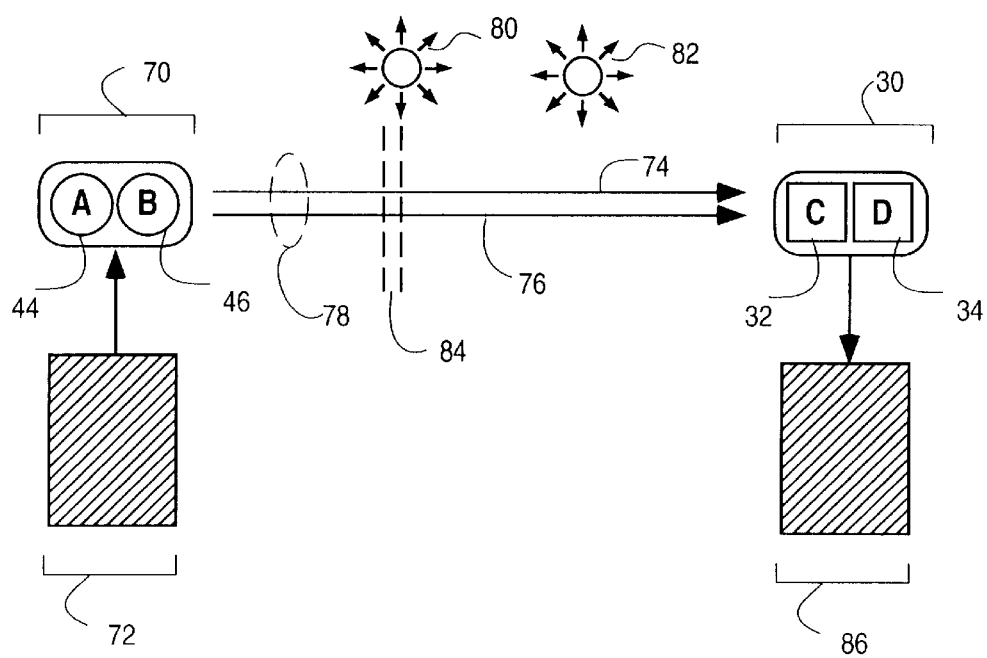
FIG. 5 is a diagram illustrating a TM2/OPS-F combination used for long-distance open-air data transmission ("LDOADT")

FIG. 5 illustrates a TM2/OPS-F combination used for long-distance open-air data transmission ("LDOADT") with characteristic high resistance to background noise, and high data transmission rates. A TM2 70 is provided with signal coding and powered by a transmitter 72. The WPSLS-1 44 and the WPSLS-2 46 of the TM2 70 include LEDs, lasers, or any light source capable of producing specific bandwidths of light in a rapid pulsed manner. A TM2 digital signal 78, comprised of a first bandwidth signal light ("WPSL-1") 74, and a second bandwidth signal light ("WPSL-2") 76, is highly resistant to common mode noise such as an ambient light 80, a 60 Hz interference 82, and atmospheric attenuations 84. The TM2 signal 78 is sensed by the OPS-F 30 and differentially converted into positive or negative voltage-phase signals by the first photodiode 32 and the second photodiode 34 of the OPS-F 30. The voltage-phase developed by the OPS-F 30 is decoded and reconstructed by a receiver 86 in an industry standard manner.

For LDOADT applications employing the OPS-F embodiment of the opsistor, by utilizing a different light bandwidth filter over each OPS-F receiver opsistor photodiode, the two transmitter light sources of the TM2 (each producing the specified different bandwidths of light) may be located at a great distance from the OPS-F receiver. In addition the OPS-F receiver may receive serial communication even though the OPS-F receiver is in motion, such as if placed on rapidly moving equipment, or even if blocked by a light diffuser such as biological tissue. For example, in the latter case, by using red and infrared light as the two TM2 wavelengths that penetrate the skin into subcutaneous tissues, a subcutaneously implanted OPS-F receiver may receive serial communications via an external TM2 transmitter to provide power and programming to an implanted drug delivery pump.

The advantages of the TM2/OPS-F combination device of this invention for LDOADT are appreciated when compared to the current art for LDOADT. Typically in the current art, a transmission LED is modulated at a carrier frequency approximately 15×higher than the target data rate or baud rate. For example, in remote control and low speed serial PC-IR links, a carrier frequency of about 38 KHz is used to transmit signal bursts to the receiver. The presence of a burst is interpreted as one logic state and the absence its compliment. By timing the signal burst properly in real time, an equivalent data rate of 300 to 2400 baud can be reliably achieved. Newer standards today for PCs have improved this data rate to over 100 kilobits per second but the working distance is just a few feet.

Signal integrity between transmitter and receiver must negotiate ambient light levels and changing attenuation. Even with bandpass filters and signal processing, the transmission rates must be compromised to obtain the required signal to noise margin over background. Signal variations from ambient behave similar to dynamic voltage offsets to the IR carrier signal and can be categorized as "noise." Depending on the receiver circuit, the maximum data rate reliably received is limited by the signal to noise ratio possible, the better the quality of the incoming signal, the faster will be the possible data rate. With open air applications ambient noise is highly dynamic, and ample guardband is reserved to ensure reliable data transmission under all conditions.

Using the TM2/OPS-F transmitter-receiver combination for LDOADT applications, instead of, for example, an intensity amplitude modulated transmitter LED and a single photodiode receiver, the TM2/OPS-F combination uses an active wavelength alternation method utilizing two separate color LEDs for transmitting logic ones and zeros to produce a voltage-phase modulation. This TM2 bi-phasic drive system transmits two wavelengths alternately to produce the effect of a carrier signal at the OPS-F receiver. For example, if GREEN and RED were the two bi-phasic wavelengths, GREEN is ON during the positive excursion of the carrier and RED is ON during the negative excursion of the carrier. These PUSH-PULL excursions are recognized as positive or negative voltage-phases at the OPS-F. This bi-phasic approach forces all ambient factors to become common mode and therefore become automatically canceled at the OPS-F input. Normal signal processing now converts the carrier into a digital data stream. A gain of better than 20 dB in S/N is obtained with the TM2/OPS-F combination. Faster data transmission and longer transmitter-receiver distances are obtainable.

Figure 6:
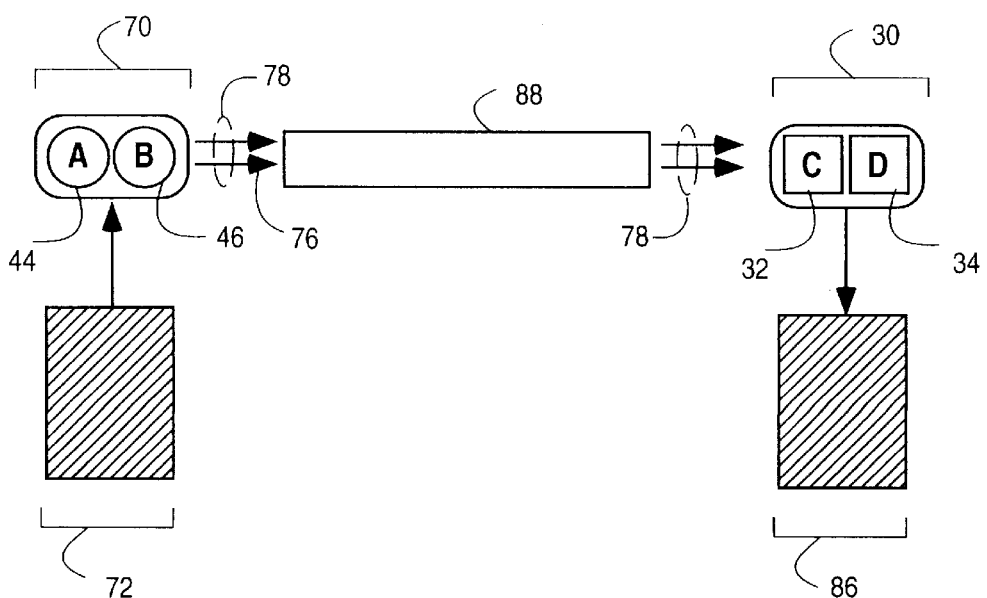
FIG. 6 is a diagram illustrating a TM2/OPS-F combination used in conjunction with a fiber optic for high-speed fiber optic data transmission ("HSFODT")

FIG. 6 illustrates a TM2/OPS-F combination used for High-Speed Fiber Optic Data Transmission ("HSFODT") with characteristic high data transmission rates, and high resistance to fiber attenuations. The TM2 70 is provided signal coding and powered by the transmitter 72. The WPSLS-1 44 and the WPSLS-2 46 of the TM2 70 include LEDs, lasers, or any light source capable of producing specific bandwidths of light in a rapid pulsed manner. The TM2 digital signal 78 comprised of the first bandwidth signal light ("WPSL-1") 74 and the second bandwidth signal light ("WPSL-2") 76 is highly resistant to fiber attenuations such as from temperature effects, mechanical stress, impurity/defect effects, and water absorption during passage through the conduit optical fiber 88. The TM2 signal 78 is sensed by the OPS-F 30 and differentially converted into positive or negative voltage-phase signals by the first photodiode 32 and the second photodiode 34 of the OPS-F 30. The voltage-phase developed by the OPS-F 30 is decoded and reconstructed by the receiver 86 in an industry standard manner.

The advantages of the HSFODT use of this invention are apparent from comparing it against current art technology. In the current art, a laser source is use to serially transmit monochromatic light signals through an optical fiber to a PiN or avalanche type photodiode detector. Data rates from 20 Mbits/second to Gigabits/second are possible with the proper combination of optics and electronics. With high end applications like telecommunication, factors such as wavelength selection, multimode fibers, low loss connectors, repeaters, and low noise detectors are optimized to achieve the best possible performance. This performance, however, can be further improved if factors such as temperature stress, mechanical stress, and fiber imperfections can be converted into common mode parameters.

By utilizing bi-phasic TM2 drive and OPS-F bi-phasic opsistor detection, the S/N ratio of a fiber link can be improved upon compared to the current art. This increase allows the use of longer span distances between repeaters and/or increased data transmission rates. The majority of noise variables within a fiber are predominantly single-ended or ground referenced. An example is attenuation variations from micro mechanical stresses along a fiber experiencing temperature fluctuations or vibration. The TM2/OPS-F combination used for HSFODT permits balanced signal detection around zero volts. In this approach, a positive voltage vector is a Logic One while a negative voltage vector is a Logic Zero. A DC-coupled amplifier can be used that eliminates many capacitor-related issues (e.g., phase and time delays) for processing ultra-fast signals. Balanced detection also eliminates the need to store a reference voltage (usually by a capacitor) needed to compare input signals against to test for Logic 1 or Logic 0. Higher data transmission rates can be achieved that increase the information bandwidth of a fiber.

With lower technology applications such as computer network fiber links, improvements in the signal-to-noise ratio will allow greater tolerance to fiber imperfections. This in turn can lower fiber cost for consumer applications. One such application may be usage of a lower grade fiber for connection into single family homes that satisfies the required data bandwidth but has higher cost effectiveness.

Figure 7A:
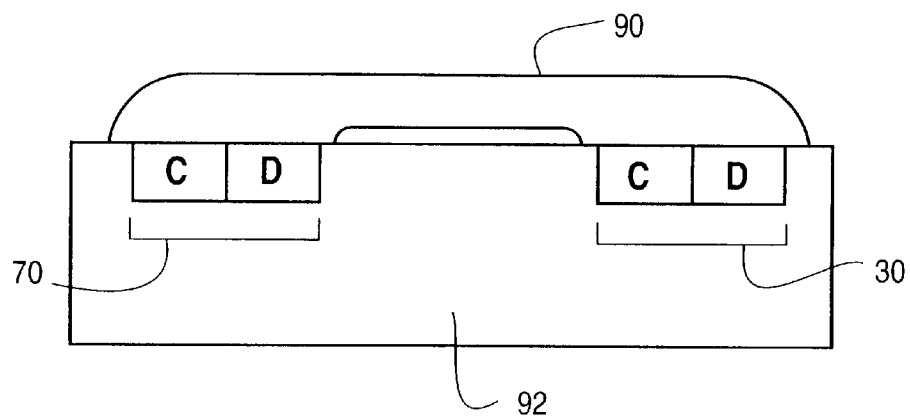
FIG. 7A is a cross-sectional diagram of a TM2/OPS-F monolithic optical fiber link used in an optoelectronic based state machine.

FIG. 7A is a is a cross-sectional diagram of a TM2/OPS-F monolithic optical fiber link used in an optoelectronic based state machine. The TM2 70, which preferably is composed of amorphous silicon LEDs, is fabricated within a monolithic silicon substrate 92. Similarly, the OPS-F 30 is also fabricated within the monolithic silicon substrate 92 using techniques standard to the industry. Digital informational data is optically transmitted from a TM2 70 to a target OPS-F 30 via a micro-optical fiber light conduit 90 fabricated upon the silicon substrate 92 using standard industry techniques.

Figure 7B:
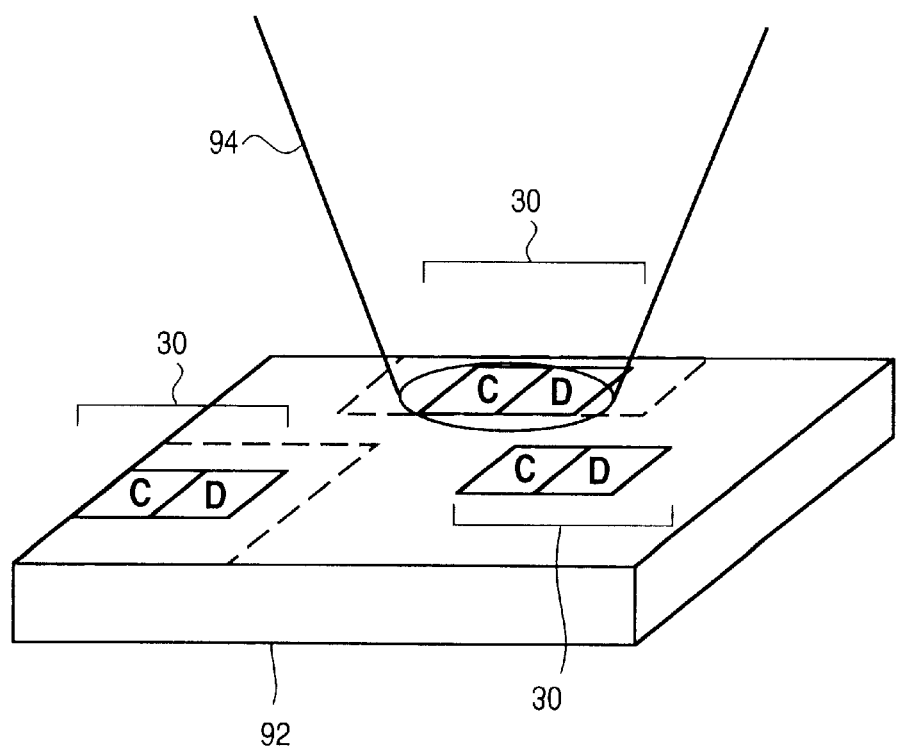
FIG. 7B is a diagram illustrating the laser write of a OPS-F disposed as one of a plurality of subunits on a monolithic silicon substrate that is used as the basic switch component of an optoelectronic based state machine, the laser write changing the voltage-phase state of the OPS-F to one of three states of the tri-state OPS-F.

FIG. 7B illustrates a laser write of a OPS-F subunit 30a disposed as one of a plurality of OPS-F subunits 30 on a monolithic silicon substrate 92. The OPS-F 30 is used as the basic switch component of an optoelectronic based state machine. Because of direct optical access, the TM2 laser beam 94 can rapidly write changes to the voltage-phase state of a large number of OPS-Fs 30 converting them to one of three OPS-F electrical tri-states.

The OPS-F based optoelectronic state machine functions in the following manner. In general, a state machine performs a specific function determined by its configuration, which can be actively changed. Field programmable logic silicon devices such as gate arrays, and one-time programmable devices are state machines that can be reconfigured to meet many different applications. In the case of a UV-erasable OTP, the computer chip is "dormant" after erasure but becomes functional again after reprogramming. The OPS-F device of this invention also has a "dormant" null state that is analogous to the "OFF" position of a mechanical center-off toggle switch. When OPS-F receiver is activated by TM2 light transmission, the switch can "toggle" to the UP or DOWN position for logic 1 (positive voltage vector) or logic 0 (negative voltage vector) respectively. Once programming is complete, the switch goes back to the center or "OFF" state (ground, 0 volts). This OPS-F tri-sate capability, therefore, allows an OPS-F based optoelectronic state machine to possess three states, represented by a positive voltage vector, a negative voltage vector, and a ground, 0 volts null.

With the OPS-F based optoelectronic state machine, the OPS-F is the input to a configuration FIFO (First In First Out) latch that defines the functionality of that state machine block, or the function of an OPS-F is latched in a high or low logic state which in turn "steers" the processing logic of the state machine. Since the OPS-F normally has a rest state that is not a logic 1 or logic 0, immunity to noise after configuration is very high. By using bi-phasic TM2 light transmission from an external source such as two laser sources or a tunable laser, or from another section of the state machine, the entire state machine can be quickly reprogrammed for functionality as the situation requires. Permitting different optoelectronic blocks to change personality or function on-the-fly minimizes the hardware required for an OPS-F based state machine (vs. traditional microprocessors that are composites of predefined functional blocks). The OPS-F "building block" permits integration of many "smart state machine" blocks based on using bi-phasic TM2 light as the primary link. In this approach, traditional requirements for serial communications, signal multiplexing, and device programming are minimized, since a "smart state machine" block can, for example, change from a "division function" to a "counter function" on-the-fly.

Advantages of such a "smart state machine" block based on the TM2/OPS-F combination over the present art include: (1) faster optocoupler transmission data rates from the active on/active off function; (2) direct laser writes into specific parts of the "smart state machine" to program "smart state machine" blocks circumvents the complexities of serial communications and signal action routing. The steering of the lasers is equivalent to traditional functions of wires and logic clocks resulting in faster operation since silicon elements do not have to be physically close but may be separated; (3) applications in bio-sensor devices where fluids may surround the silicon; and (4) field programmable devices where isolation preservation is important.

Figure 8:
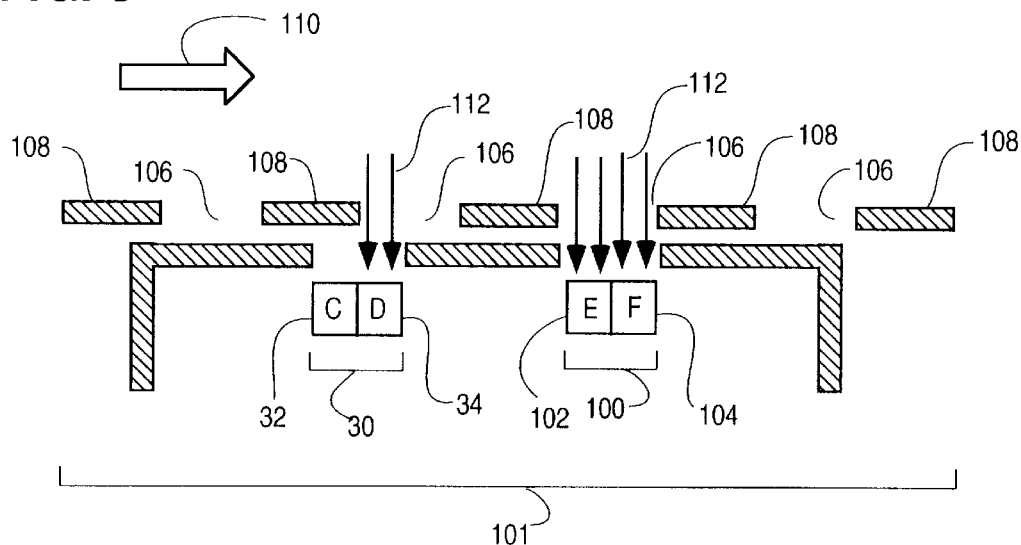
FIG. 8 is a diagram illustrating two opsistors used as the photodetectors in a high-resolution optical encoder.

FIG. 8 (OPTICAL QUADRATURE ENCODER) illustrates the opsistor device of this invention used in place of standard photodiode detectors employed in an optical encoder to double the resolution of the encoder without increasing the slot count of the rotor disk. A photo-sensing portion 101 within an optical encoder utilizing the device of this invention, employs a first opsistor 30 and a second opsistor 100 as the photodetectors. The first opsistor 30 has a first photodiode subunit 32, designated "C," and a second photodiode subunit 34 designated "D." The second opsistor 100 has a first photodiode subunit 102 designated "E," and a second photodiode subunit 104 designated "F." Illumination 112 to the opsistors 30 and 100 passes through the rotor slots 106 created between the rotor vanes 108. Movement of the rotor in FIG. 8 is shown by the arrow 110. The 2×resolution quadrature signal of the photo-sensing portion 101 of the opsistor based encoder results because the rotor slots 106 of the optical encoder section 101 are each effectively split into two portions by each of the opsistors 30 and 100. As the illumination 112 from the rotor disk slots 106 passes over the first photodiode subunit 32 and 102 of either opsistor 30 and 100, a voltage-phase in one direction will develop in that respective opsistor. As the illumination 112 from the rotor disk slots 106 continues to move over the entirety of either opsistor surface and illuminates both of the photodiode subunits 32 and 34, or 102 and 104, a voltage-phase null will occur. When the illumination 112 from the rotor disk slots 106 begin to pass preferentially over the second photodiode subunit 34 and 104 of either opsistor 30 and 100, the voltage-phase will become inverted in the opposite direction. The slot widths 106 are thus functionally split into two portions each. A two-slot, two-opsistor quadrature encoder can achieve twice the resolution of the same encoder using two standard photodiodes.

Figure 9A:
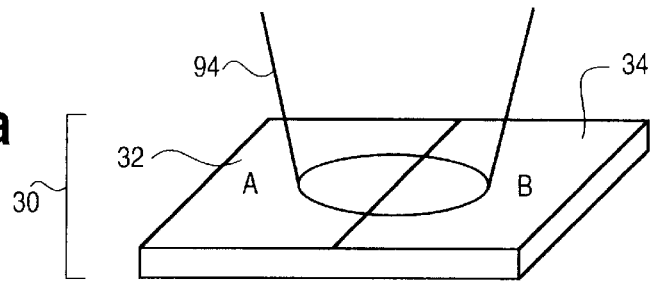
FIGS. 9A–C are diagrams illustrating an opsistor disposed on a monolithic substrate and used as a linear optical position sensor ("LOPS"), a voltage null being produced when the illuminating light spot is equally illuminating both photodiodes of the opsistor, and a voltage-phase in one direction or in the opposite direction occurring as soon as a small misalignment of the light spot occurs that would favor one or the other photodiode subunit of the opsistor.
Figure 9B:
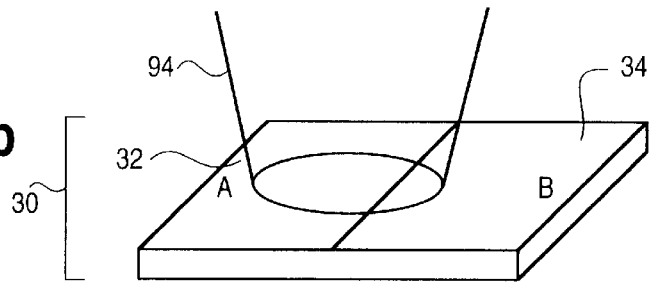
Figure 9C:
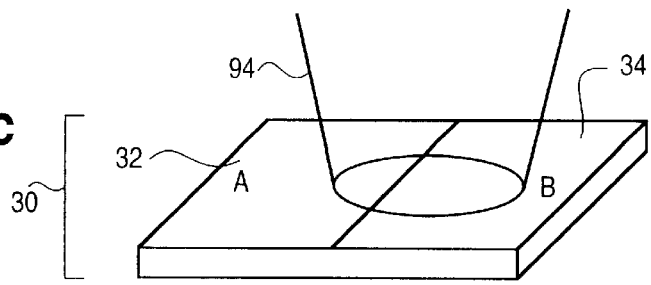

FIGS. 9A–9C illustrate the opsistor of the present invention used as a precise linear optical position sensor ("LOPS"). In FIG. 9A, a null of the voltage-phase develops when the illumination 94 of the two photodiode subunits 32 and 34 of the opsistor 30 is equal. A rapid shift of the voltage-phase to positive or negative develops in a flip-flop manner as soon as one of the two opsistor photodiode subunits 32 and 34 become preferentially illuminated as shown in FIGS. 9B and 9C. As the voltage-phase of the opsistor 30 responds to light balance only over its two photodiode subunits 32 and 34, which may be fabricated together very closely on a monolithic silicon substrate, the opsistor's rejection of common mode attenuations such as ambient light and temperature effects is high. Uses of a LOPS device such as that shown include micro-beam balances, optical alignment applications, motion sensors, and image recognition devices based on edge detection.

Figure 10:
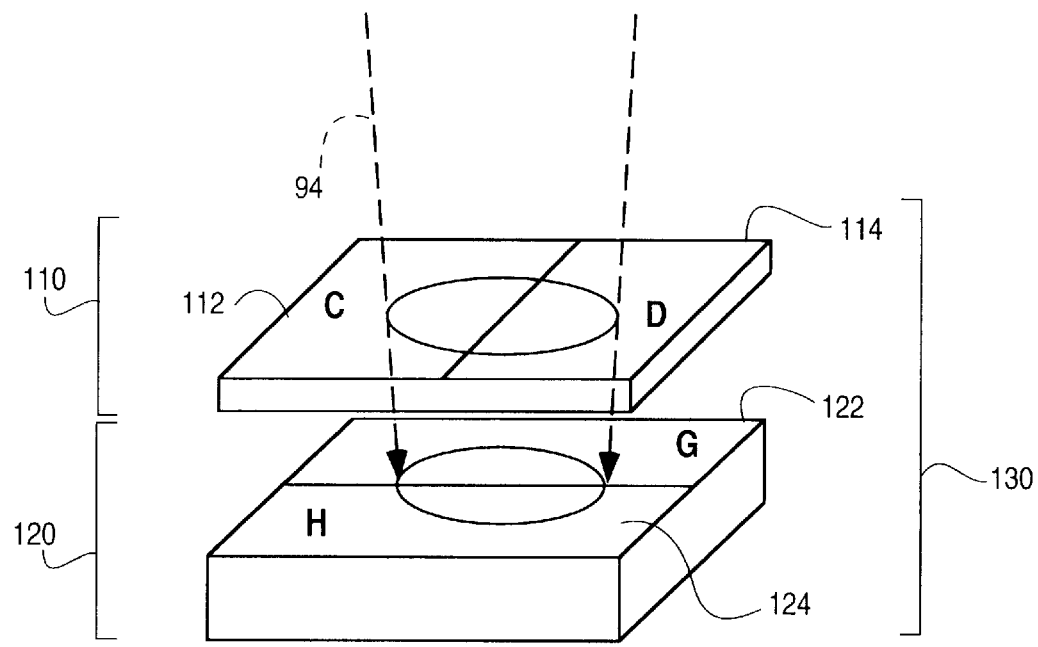
FIG. 10 is a diagram illustrating a first thin substrate opsistor-based LOPS, transparent to the light source being sensed, placed over a second opsistor-based LOPS rotated at 90 degrees relative to the first LOPS to produce a two-dimensional target sensor.

FIG. 10 illustrates a two-dimensional target sensor 130 constructed from two "stacked" LOPS opsistors 110 and 120 aligned so that the "top" LOPS opsistor 110, consisting of photodiode subunits 112 and 114, which is fabricated within a thin silicon substrate transparent to infrared light, is aligned at 90 degrees rotated from the "bottom" LOPS opsistor 120, consisting of photodiode subunits 122 and 124. Such a target sensor 130 uses one LOPS opsistor sensor 110 and 120 for each axis of position sensing of a light target 94. Characteristics and quality of such a two-dimensional target sensor 130 include simple fabrication and minimal dead-spot area, in addition to all of the characteristics of the single LOPS sensor. Uses of such a LOPS device include those requiring high precision two-dimensional alignment, weapons targeting, spectrophotometer micro-two-dimensional alignments, and micro-machine/micro-fabrication jig alignment.

The basic opsistor of the present invention shown in FIG. 1 is not restricted to the use of photodiodes. An opsistor type sensor may be created from any pair of sensory devices that will produce DC phase currents as a function of its input. Examples of such devices are magnetic pickups, coils, photodiodes, thermocouples and piezo- electric elements. The "bucking" of two self-powered independent currents is the key behind the functional attributes of the opsistor circuit in FIG. 1. This characteristic allows the power of differential processing, normally performed by other circuits in conventional amplifiers, to be placed directly into the sensor elements.

Figure 11:
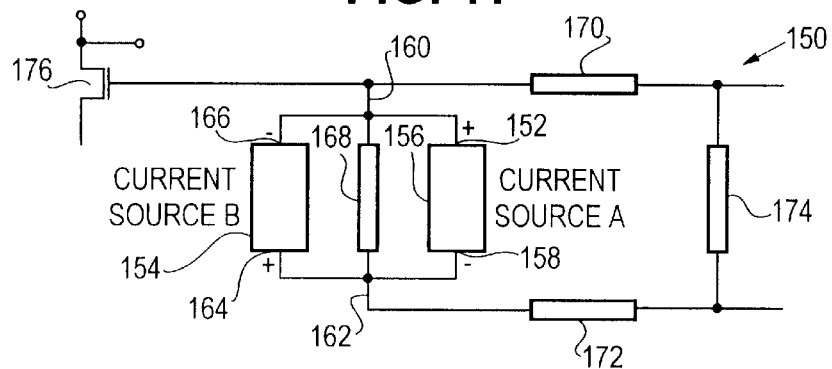
FIG. 11 is a block diagram of the configuration for a general current operational amplifier according to the present invention.

A further application of the opsistor circuit with DC phase current sensor elements may be seen in an operational amplifier circuit 150 in FIG. 11. The operational amplifier circuit 150 couples two DC current producing sensors 152 and 154 in parallel but in an inverse polarity manner. The first current producing sensor 152 has a source current terminal 156 and a sink current terminal 158. The source current terminal 156 is coupled to a first output terminal 160 and the sink current terminal 158 is coupled to a second output terminal 162. The second current producing sensor 154 has a source current terminal 164 which is coupled to the second output terminal 162 and a sink current terminal 166 which is coupled to the first output terminal 160. The above described components 152–166 are a general opsistor circuit such as the photodiode based opsistor shown in FIG. 1.

In operation, a first sensor input is operatively coupled to the first current producing sensor and emits a first input signal. A second sensor input is operatively coupled to the second current producing sensor and emits a second input signal. For example, when the current producing sensors are photodiodes the sensor inputs are light signals. When the current producing sensors are magnetic pickups the sensor inputs are magnetic signals. When the current producing sensors are coils the sensor inputs are magnetic fields. When the current producing sensors are thermocouples the sensor inputs are heat sources. When, the current producing sensors are piezoelectric sensors the sensor inputs are pressure sources.

A differential impedance element 168 is added in parallel to current producing sensors 152 and 154 to the general circuit to create a current based operational amplifier. The impedance element 168 is tied between the first terminal 160 and the second terminal 162. Additional passive components such as resistors, inductors and capacitors may be added to the basic opsistor operational amplifier circuit 150 shown in FIG. 11. These passive components may be connected to the opsistor operational circuit structure of current producing sensors 152 and 154 and impedance element 168 to control and tailor its performance. An impedance block 170 is coupled to the first terminal 160. An impedance block 172 is coupled to the second terminal 162. An impedance block 174 is coupled between the impedance blocks 170 and 172. The impedance blocks 170, 172 and 174 may be integrated into the basic differential opsistor circuit and represent combinations of resistive, inductive and capacitive elements. These elements 170–174 may be intentionally fabricated into the opsistor operational amplifier such as by the process explained above in reference to FIGS. 3–4 in order to shape the output waveforms from the amplifier. These elements 170–174 may also represent parasitic impedances of the opsistor current sensing elements which may also be used to shape the output waveforms.

With regard to the opsistor operational amplifier in FIG. 11, the two current producing sensors 152 and 154 are connected as a closed loop. In this parallel but opposing configuration, the two current producing sensors 152 and 154 have equal loads in forcing a stimulus current around the loop. If the currents through current producing sensors 152 and 154 are equal, the two terminals 160 and 162 will be in perfect balance and an output of 0 volts will result across the terminals 160 and 162. The differential impedance element 168 connected across the two terminals 160 and 162 will show no current flow. This condition is maintained even if stimulus on the current producing sensors 152 and 154 is increased, as long as the stimulus remains equal. For example, the current producing sensors 152 and 154 may be photodiodes which are exposed to equivalent amounts of light. Since the current produced as a result of the light is equal across the current producing sensors 152 and 154 there will be no current flow across the differential impedance element 168.

The opsistor operational amplifier 150 is analogous to a simple balance beam where zero balance is maintained as long as the weights on each side are equal. The absolute weight values (input values to current elements) do not effect the circuit output. This unique "balance beam" property permits the opsistor operational amplifier circuit 150 to confine sensor current flow into a closed loop. External electrical noise contamination is therefore eliminated or minimized.

Imbalances in sensor current flow will result in an error current flowing through the differential impedance element 168. Only then is a voltage produced across the terminals 160 and 162. This voltage may be sensed using an optional FET amplifier 176 whose gate is coupled to the differential impedance element 168 at terminal 160. The output of the FET amplifier 176 amplifies any voltage on the differential impedance element 168 to determine an error current in the operational amplifier 150.

Figure 12:
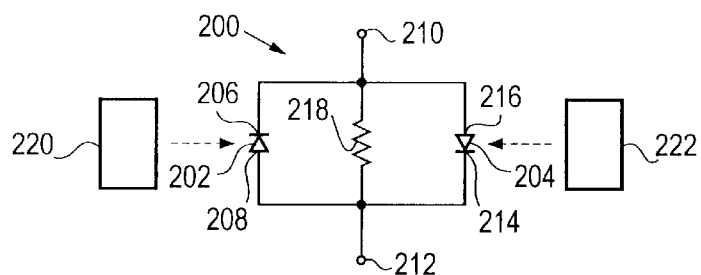
FIG. 12 is a circuit diagram for an operational amplifier based on the opsistor in FIG. 1.

FIG. 12 shows an opsistor optical operational amplifier 200. The operational amplifier 200 is a basic optoelectronics building block for more complex optical electronic circuits which will be described below. The operational amplifier 200 has two photodiodes 202 and 204 connected in an opsistor configuration. The photodiode 202 has a cathode 206 and an anode 208. The cathode 206 is coupled to a first output terminal 210 while the anode 208 is coupled to a second output terminal 212. The photodiode 204 has a cathode 214 coupled to the second output terminal 212 and an anode 216 coupled to the first output terminal 210. A differential resistor 218 is coupled across the terminals 210 and 212 and is parallel to the photodiodes 202 and 204.

The photodiode based opsistor shown in FIG. 1 may be configured as the variable gain operational amplifier 200 in FIG. 12 simply by adding the differential resistor 218 across the two output terminals 210 and 212. The value of the differential resistor 218 determines the gain of the opsistor operational amplifier 200 and may be adjusted to vary the gain of the amplifier 200. With infinite resistance, the opsistor operational amplifier 200 will function as an open loop gain amplifier where the output voltage at terminal 212 will quickly swing between the internal compliance voltage, +V and −V, of the photodiodes 202 and 204.

If one photodiode such as photodiode 202 is biased with a steady DC light source 220 whose light is equivalent to the average DC light component of a variable light signal source 222, the output across the terminals 210 and 212 will be an amplification of the AC component of the signal emitted by the variable light signal source 222. Thus, a steady light signal on the photodiode 202 serves to balance out the DC light component of the signal generated by the photodiode 204 from the signal emitted by the variable light signal source 222. The operational amplifier 200 thus amplifies only the AC component of the variable signal source 222.

For example, in the case of PiN type silicon based photodiodes fabricated by standard CMOS processing, a PiN photodiode is produced from high resistivity N-type silicon with thickness in the range of several microns to several mils. The bulk resistivity is typically in the range of 20 ohm-cm to 10,000 ohm-cm. Shallow P-type diffusions under 1 micron in depth are then diffused into the N substrate to form photovoltaic junctions. For such typical photodiodes, the amplified signal output from the output terminals 210 and 212 will typically swing between +/−400 mV and have a linear response. The intensity of light needed to produce maximum output is controlled by the value of the differential resistor 218 across the terminals 210 and 212. Of course, other voltage ranges may be used depending on the photodiode type. The light sensitive silicon regions of the photodiodes 202 and 204 can be of any size or geometric shape. Other photodiode structures that can function as opsistor sensors include, but are not limited to, PN diodes, avalanche diodes, amorphous PiN diodes and non-silicon photodiodes such as germanium (Ge), gallium arsenide (GaAs), indium gallium arsenide (InGaAs), and indium phosphide (InP).

When the resistance of the differential resistor 218 is infinite, the gain of the operational amplifier 200 is at maximum which is identical to a conventional analog operational amplifier in an open-loop gain configuration. Instead of a conventional five pin operational amplifier component (power, ground, input A, input B, output), the opsistor operational amplifier 200 is a two pin device two output terminals 210 and 212 (output and ground). The two inputs A and B are driven strictly by light signals emitted on the photodiodes 202 and 204. The power pin in a conventional operational amplifier is not required as the opsistor operational amplifier 200 is self-powered from the photo voltaic energy generated from light signals emitted on the photodiodes 202 and 204.

The basic operational amplifier 200 shown in FIG. 12 may be configured for many well known analog and digital circuits. Examples of some basic circuits are described below with reference to FIGS. 13A–13G. These circuits use the opsistor optical operational amplifier 200 in FIG. 12 as a building block. Identical components in these examples have identical element numbers to their counterparts in the operational amplifier 200 shown in FIG. 12.

Figure 13A:
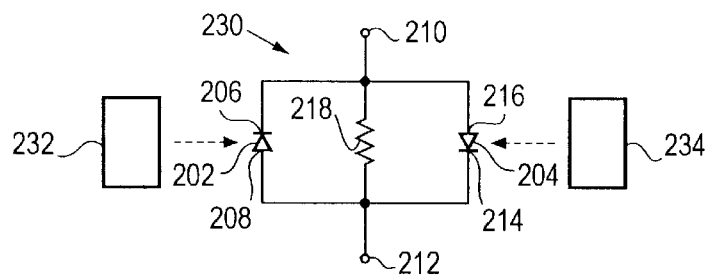
FIGS. 13A–13G are circuit diagrams for various applications for the operational amplifier in FIG. 12, such as a non-inverting amplifier, an inverting amplifier, a signal demodulator, a signal modulator, a low pass filter, a high pass filter and a bandwidth filter.

FIG. 13A shows a non-inverting gain amplifier circuit 230. A reference light source 232 emits a light signal on the photodiode 202. The photodiode 202 has its cathode 206 coupled to the selected terminal 210 which is designated as the output terminal of the circuit 230. The other terminal 212 is then tied to ground. An input signal source 234 emits light on the photodiode 204. As the signal from the photodiode 204 increases due to the input signal source 234, the opsistor voltage as governed by the differential resistor 218 will increase. Thus, the signal on the photodiode 204 increases with the input signal from the input source 234.

Figure 13B:
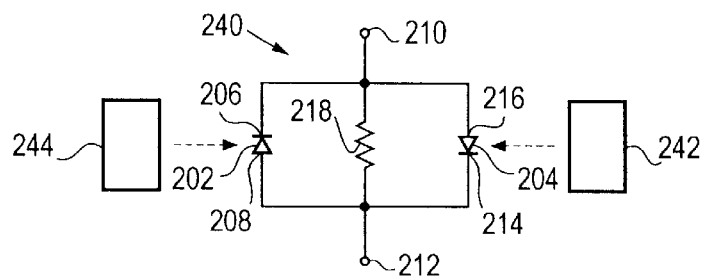

FIG. 13B shows an inverting gain amplifier circuit 240. A reference light source 242 emits a light signal on photodiode 204. The photodiode 204 has its anode 216 coupled to the selected terminal 210 which is designated as the output terminal for the gain amplifier circuit 240. The opposite terminal 212 is tied to ground. An input signal light 244 emits a light signal on the other photodiode 202. As the signal on the photodiode 202 increases, the opsistor voltage as governed by the differential resistor 218 will decrease.

Figure 13C:
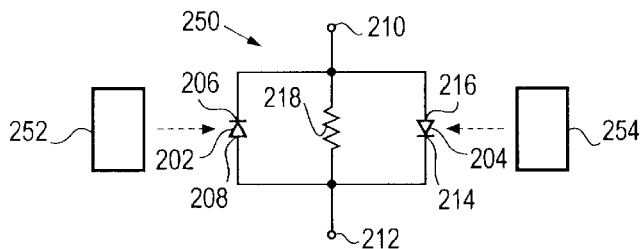

FIG. 13C shows a signal modulator circuit 250. An input light source 252 emits a light signal on photodiode 202. The photodiode 202 has its anode 206 coupled to the selected opsistor output terminal 210 which is designated as the output terminal for the modulator circuit 250. The light signal emitted by the input light source 252 is a low frequency signal having a frequency of B. The opposite terminal 212 is tied to ground. A modulation carrier source 254 outputs a light signal of frequency A on the opposite photodiode 204. The resulting opsistor voltage at the terminal 210 is the low frequency signal B modulated by carrier frequency A. The gain of the resulting voltage is governed by the differential resistor 218.

Figure 13D:
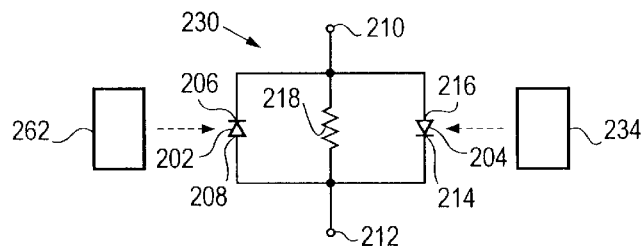

FIG. 13D shows a signal demodulator circuit 260. A modulated input light is produced by a modulator light source 262. The modulated light signal from the modulator light source 262 is emitted on the photodiode 202. The photodiode 202 has its cathode 206 coupled to the selected opsistor terminal 210 which is designated as the output terminal of the demodulator circuit 260. The opposite terminal 212 is tied to ground. A demodulation frequency source 264 produces a light signal having a frequency, F, on the opposite photodiode 204 and is 180 degrees out of phase compared to the input signal incident on photodiode 202. The resulting opsistor voltage is then the demodulated low frequency signal where amplification is governed by the differential resistor 218. The frequency F has a much greater magnitude than that of the input signal. Phase lock is achieved by monitoring the residual amplitude of frequency F at the opsistor output terminal 210. Any signal sensed at the output terminal 210 represents a phase error. The light phase of the demodulation source 264 may then be adjusted until no signal is detected at the output terminal 210.

Figure 13E:
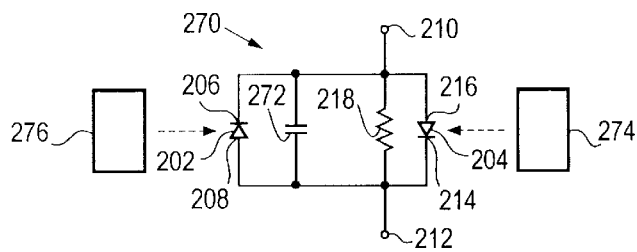

FIG. 13E shows a low pass filter circuit 270. A capacitor 272 is coupled between the terminal 210 and the terminal 212. The photodiode 202 and the capacitor 272 are coupled in parallel with the photodiode 204 and the differential resistor 218. An input light signal is emitted from an input source 274 on photodiode 204. The photodiode 204 has its anode 216 coupled to the terminal 210 which is designated as the output terminal for the low pass filter circuit 270. The opposite terminal 212 is then tied to ground. The photodiode 202 is held at a fixed illumination bias level by a fixed light reference source 276. Only low frequency optical components in the input signal from the input source 274 will be amplified by the low pass filter circuit 270. Any high frequency signals are attenuated by the capacitor 272. The value of the capacitor 272 determines the frequency cutoff of the low pass filter circuit 270. Thus, the low pass filter circuit 270 is identical in function to a conventional operational amplifier low pass filter. When there is no input signal, the opsistor output is at the −V internal compliance voltage potential of the photodiodes 202 and 204.

Figure 13F:
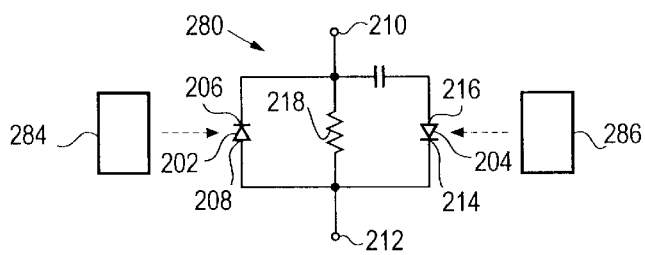

FIG. 13F shows a high pass filter circuit 280. The high pass filter circuit 280 has a capacitor 282 coupled between the terminal 210 and the photodiode 204. The combination of the capacitor 282 and the photodiode 204 in series is coupled in parallel to the differential resistor 218. An input light source 284 produces a light signal which is exposed to photodiode 204. The photodiode 204 has its anode 216 coupled to the output terminal 210. The opposite terminal 212 is then tied to ground. The photodiode 202 is held at a fixed illumination bias level by a fixed light source 286. The capacitor 282 insures that only high frequency optical components in the input signal from the input source 284 will be amplified. Low frequency signals from the input signal are attenuated by the capacitor 282. The value of the capacitor 282 determines the frequency cutoff. Thus, this circuit is identical in function to a conventional operational amplifier high pass filter. When there is no input to the photodiode 202, the output at the terminal 210 is at the −V potential.

Figure 13G:
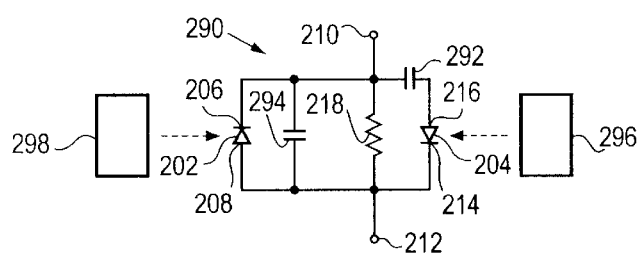

FIG. 13G shows a band pass filter circuit 290. The band pass filter 290 has a capacitor 292 coupled between the terminal 210 and the anode 216 of the photodiode 204. The combination of the capacitor 292 in series with the photodiode 204 is coupled in parallel with the differential resistor 218 and the photodiode 202. An additional capacitor 294 is coupled in parallel to the differential resistor 218, photodiode 202, and the series combination of the photodiode 204 and the capacitor 292. As in the previously described high and low pass filter circuits 270 and 280 in FIGS. 7E and 7F, an input source 298 emits a light signal on the other photodiode 202. A reference light 296 emits a light signal on photodiode 204 causing it to be held at a fixed illumination bias level. Since the capacitor 294 attenuates low frequency signal inputs, and the capacitor 292 attenuates high frequency input signals, only signal frequencies between the low and high cutoff frequencies are amplified. The values of the capacitors 292 and 294 determine the low and high frequency cutoffs, respectively.

In the above examples, the opsistor operational amplifier may be placed in a reverse bias mode. DC reverse biasing of the opsistor operational amplifier 200 shown in FIG. 12 will increase response speeds similar to gains for a single photodiode in reverse bias. All standard operational amplifier circuits such as those described above in FIGS. 13A–13G may be modified to use the reverse bias configuration. Reverse bias requires two floating DC power supplies. Each supply will reverse bias one opsistor photodiode 202 or 204 to a specific DC voltage level. A range between 3 to 20 volts is preferred with most photodiodes. Reverse bias beyond 8 volts produces diminishing returns for increasing photodiode performance. Identical to reverse biasing a single photodiode, the opsistor response bandwidth will increase 5 times or more under reverse bias. By varying the gain of the opsistor operational amplifier dynamically, many powerful applications are possible. In track and hold applications such as closed loop and target controls, it is desirable to amplify the initial tracking signal by a low gain. Once the object is acquired, it is desirable to increase the gain to arrive at a precise lock on the object.

For example, in machine vision component placement, the target hole of a moving printed circuit board can be targeted by a low gain search and then locked onto with higher gain. This allows component placement servos to tightly track the center of a target hole to minimize insertion errors and increase production speed. Linear synchronization is another application where a machine member must move in synch with the speed of a product. In registration control on a moving production line where a moving laser head is used to imprint product information, consistency of imprints is important for both quality and appearance. Registration marks are normally used with a single photodetector switch for synchronization, but this technique has low throughput and marginal repeatability. With an opsistor sensor, low gain can be used to detect the registration mark as it moves into view. High gain automatically follows to lock onto the center of this mark, regardless of the variation in line width. The resultant graded error signal will then permit perfect matching of laser and product speeds, leading to higher production rates.

Figure 14:
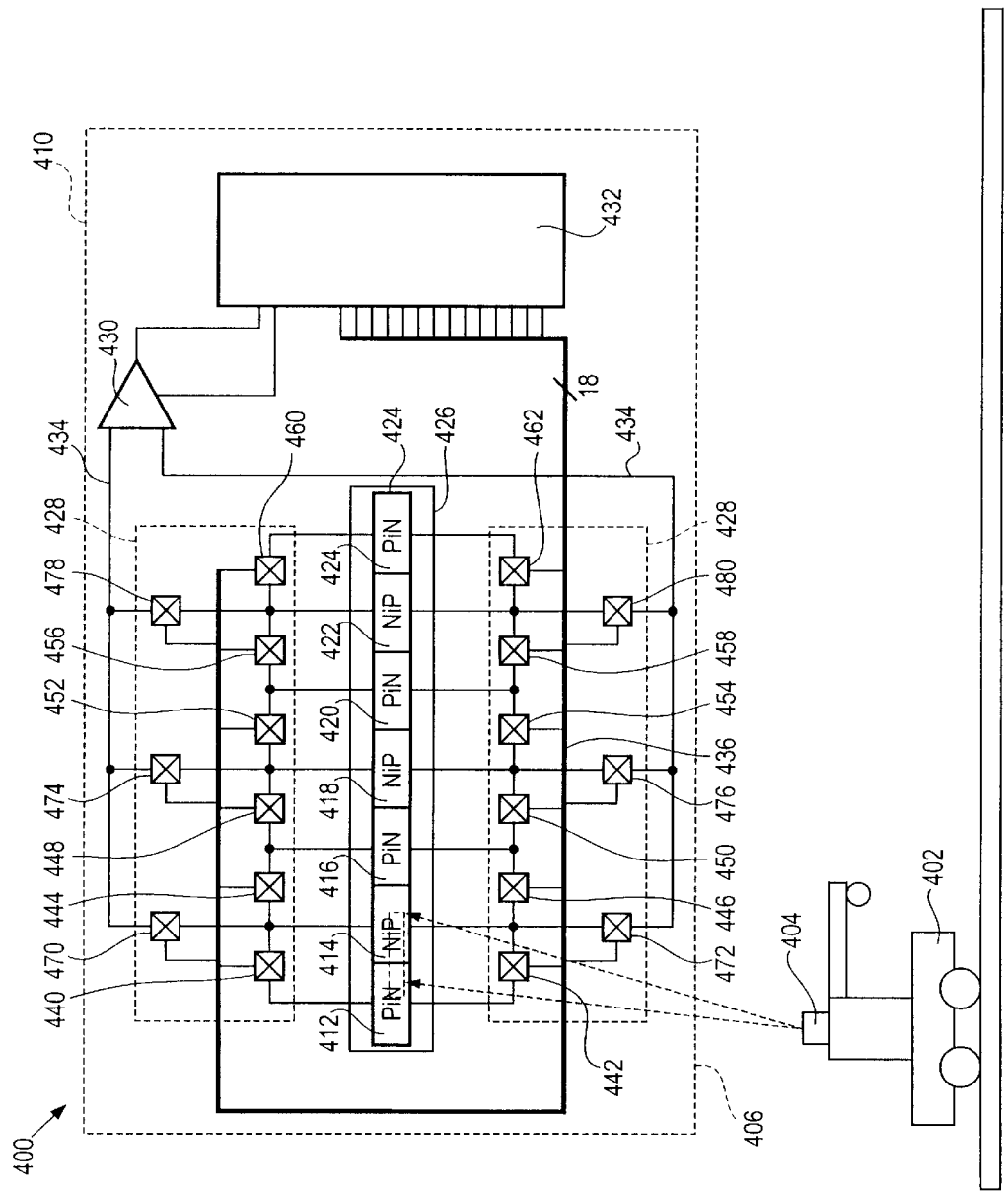
FIG. 14 is a circuit diagram of an optical ruler using circuits according to the present invention.

An example of an application of the optical switch or opsistor according to the present invention is an optical ruler system 400 shown in FIG. 14. The optical ruler system 400 measures the position of an object 402 such as a machine member which has a light source 404. The light source 402 emits a line light beam 406 which impinges on an opsistor measurement sensor 410. The light source 402 may be a diode laser line light beam or an incandescent slit lamp or other focused light source. The light source 402 is mounted to the controlling machine member 402 and aimed in a direction of choice perpendicular to the axis of motion control (X, Y or Z). Non-perpendicular orientations are also supported but a scaling factor is required to compensate for angular compression. The line light beam projected onto this selected plane will then move in proportion to the motion of the machine member. Once alignment is established, the opsistor position measurement sensor 410 is mounted to this plane to overlay the line light beam's path of travel. Separation of the light source 404 and the opsistor position measurement sensor 410 can be from several inches to many feet without losing control accuracy. In machine control applications, motion in a dirty or harsh environment can thus be sensed in a clean area without contamination problems.

The opsistor position measurement sensor 410 has multiple photodiode elements 412, 414, 416, 418, 420, 422 and 424, arranged in series. There are seven photodiode elements 412–424 in the opsistor position measurement sensor 410 shown in FIG. 14, however, it is to be understood that different numbers of photodiode elements may be used depending on the range of positions desired to be measured.

Each photodiode element 412–424 has a photo sensitive surface which may be of various lengths of 1" to 2" segments. The line light beam 406 emitted by the light source 404 impacts a length which is longer than any individual photodiode element. Other surface lengths for the photodiode elements may be used depending on the length of the light line beam. In this embodiment, the length of the photo sensitive surface of the photodiodes 412–424 is 1 inch and the line light beam is approximately 1.5 inches in length. These photodiode elements 412–424 are bonded to a support surface 426 and are electrically connected to an analog switch array 428. The photodiode elements 412–424 consist of alternating PiN photodiodes (photodiodes 412, 416, 420 and 424) and NiP photodiodes (photodiodes 414, 418, and 422). The photodiodes 412–424 are coupled to each other and their respective photo sensitive surfaces create a continuous sensing surface.

As the line light beam 406 from the light source 404 travels down the opsistor position measurement sensor 410, two adjacent photodiode elements such as photodiode elements 412 and 414 will always sense the line light beam. The output of the photodiode elements 412–424 is amplified using an operational amplifier 430 having an adjustable gain. A microprocessor 432 reads the output to the photodiodes 412–424 via the output of the operational amplifier 430 through a series of measurement lines 434. The microprocessor 432 also controls the gain of the operational amplifier 430. The microprocessor 432 controls the analog switch array 428 via a series of scan control lines 436. Of course any suitable microprocessor or microcontroller and circuit configuration may be used to control the optical sensor 410 in the manner to be described below.

The electrical multiplexing of the signals from the photodiode elements 412–424 of the opsistor measurement sensor 410 is accomplished by the analog switch array 428. In the preferred embodiment, the switch array 428 has a series of CMOS-switches 440, 442, 444, 446, 448, 450, 452, 454, 456, 458, 460 and 462 controlled by the scan control lines 436. Each pair of NiP and PiN photodiodes such as photodiodes 412 and 414 are coupled to two switches such as switches 440 and 442. When switches 440 and 442 are closed via a signal from the scan control lines 436, the photodiodes 412 and 414 will be scanned by the microprocessor 432 via the scan lines 436. This is the proper element pair to select if the incident line light beam 406 emitted by the light source 404 is approaching the opsistor position measurement sensor 410 from the left side of FIG. 14. Additional control switches 470, 472, 474, 476, 478 and 480 allow the microprocessor 432 to read the output signals from the photodiodes 412–424. With photodiodes 412 and 414 selected, switches 470 and 472 will then be turned ON via the scan control lines 436 which connects the photodiode elements 412 and 414 to the microprocessor 432.

Each scan line switch 470–480 supports two combinations of photodiode pairings from the photodiode elements 412–424. For example, the switches 470 and 472 are used to scan the photodiode elements 412 and 414 as well as the photodiode elements 414 and 416. Likewise, switches 474 and 476 will scan photodiode elements 414 and 416 and photodiode elements 416 and 418, respectively.

Only one photodiode element pair of either a PiN photodiode and a NiP photodiode combination such as photodiode elements 412 and 414 or a NiP photodiode and a PiN photodiode combination such as photodiode elements 414 and 416 are scanned by the microprocessor 432 at any given moment. Once a photodiode element pair is selected via a signal on the appropriate line of the scan control lines 436, the microprocessor 432 will perform the necessary slope and ratio processing which will be explained below to determine the exact centroid for the incident light beam 406.

Figure 15:
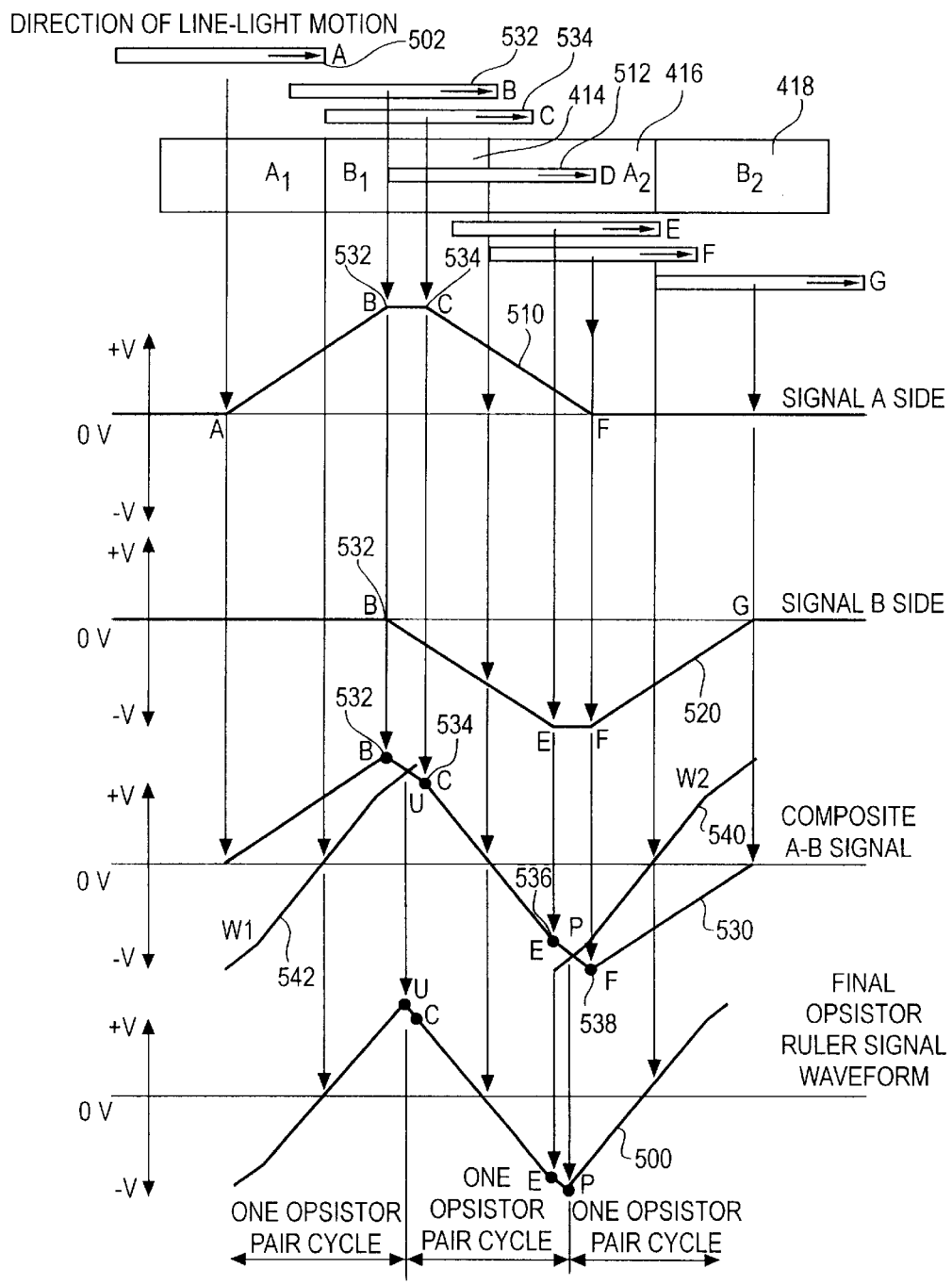
FIG. 15 is a graph of output waveforms produced by the optical ruler in FIG. 14.

The operation of the opsistor ruler system 400 will now be explained with reference to FIG. 14 and FIG. 15 which is a graph of the output signals from the photodiode elements 412–418 read by the microprocessor 432. As the incident line light beam 406 moves across the opsistor position measurement sensor 410 the output voltage generated will be a linear ramp 500 as shown in FIG. 15. In FIG. 15, an impact area 502 created from the line light beam 406 emitted from light source 404 moves parallel to the photodiode elements 412–424 and has a line length that exceeds the length of any one photodiode element 414–424. As the line light beam 406 enters from the left of the measurement sensor 410, the PiN photodiode element 412 is excited by the impact area 502, then NiP photodiode element 414 is excited, then the photodiode element 416 is excited, and so forth exciting each photodiode element 412–424 in sequence.

The composite output signal is a summation of the signals from the selected photodiode element pair such as photodiode elements 412 and 414. A top waveform 510 in FIG. 15 shows the voltage output function of photodiode element 414 as the impact area 502 of the line light beam 406 moves across its photo sensitive surface. As indicated in FIG. 15 the photodiode elements 414 and 416 are selected as the active opsistor pair. Neutrality of null which is an equal balance for light intensity distribution between the photodiode elements 414 and 416 is established when the impact area 502 is in a position indicated by a point 512.

As the impact area 406 of the line light beam 406 moves right from the photodiode element 414, photodiode element 416 will become illuminated. A second waveform 520 of FIG. 15 shows the voltage output of photodiode 416 as the impact area 502 travels across its photo sensitive surface. Since photodiode elements 414 and 416 are connected as the opsistor pair, the two signals will be summed together. A third waveform 530 in FIG. 15 indicates the sum of the outputs of photodiode elements 414 and 416. The composite signal is shown by points 532, 534, 536 and 538. These four points 532–38 represent the functional range of voltage amplitude and linear response offered by the particular opsistor photodiode element pair (photodiode elements 414 and 416). When the impact area 502 of the line light beam 406 moves beyond this range to the right, the selection for the opsistor pairing is dynamically changed by the microprocessor 432 to locate a new opsistor pair on which the impact area 502 is now incident on. The next opsistor pair will be photodiode elements 416 and 418. This new composite signal is indicated by a dashed line 540. If the line light beam 502 happens to be moving left instead, a dashed line 542 will be the next waveform produced by the new opsistor pair photodiodes 412 and 414.

Changeover from one opsistor pair to the next is done at the top portion of each composite signal waveform. It is not critical when the switchover to the opsistor pair actually occurs but it must be completed in the time window represented by points 532 and 534 (positive changeover) or points 536 and 538 (negative changeover) where the signal contribution from the photodiode element 414 in the photodiode pairs photodiodes 412 and 414 and photodiodes 414 and 416 are equivalent. In this changeover zone between points 532 and 534, the signal from the dominant photodiode element 414 can be combined with the signal from either photodiode elements 412 or 416 to determine the exact line light beam position and correspondingly the object 402. If the line light beam 406 was moving from point 532 to point 534, the signal from photodiode element 414 will drop photodiode element 412 and immediately reconnect the signal from the photodiode element 416 somewhere within this changeover zone between points 532 and 534.

Combining the signals from successive opsistor elements produces the last waveform 500 in FIG. 15. With the dual slope waveform 500, the controlling microprocessor 432 quickly determines the absolute position of the impact area 502 of the line light beam 406 on the photodiode elements 412–424 by sensing the activated photodiode element pair and calculating the position using the value of the output signal. Each position along one opsistor pair cycle such as photodiode elements 412 and 414 has only one unique voltage value.

The optical ruler system 400 uses ratios to calculate the position of the object 402. Marker points which are analogous to road mileage markers at known distances are used to insure accuracy. The signal output of the optical ruler system 400 between marker points is a saw tooth waveform such as waveform 500 in FIG. 15 that crosses 0 volts at various marker positions along the length of the position measurement sensor 410. By knowing the specific distance between two adjacent marker points, the sawtooth waveform can be very accurately interpolated at high speeds. For example, a 2" center to center spacing between marker points will produce a 800 mV signal with less than 20 uV noise. This equates to a spatial resolution of one part in 40,000. For the industry standard resolution of 0.001", only 2,000 parts are required. If the opsistor 800 mV signal were restricted to only 0.1" movement, a resolution of 0.06 um or 600 angstroms at low frequency is possible.

The impact area 502 of the line light beam 406 falling onto the photo sensitive surfaces of the photodiode elements 412–424 will produce an intensity distribution along its exposure. With an ideal light source, the intensity distribution along this the length of this impact area will be highly uniform. In such a case, the voltage variations produced as the light line beam 406 moves across the photodiode elements 412–424 is linear. For example, if the impact area 502 is 0.500" away from a marker null at +300 mV output, this output voltage will linearly decrease to +150 mV at 0.250", be at 0V at marker null, and at –300 mV at the –0.500" point. A graph of +/– output voltage versus distance from null (0 volts) will be a straight line.

If the light distribution of the source is imbalanced (certain segments of the line light beam have higher intensities that other segments), then the centroid of the projected line light beam will not be the same as the geometric center. In this condition, the output voltage from the selected photodiode element pair will reveal distortions and the graph of output voltage versus distance will not be a straight line. The output voltage may change slowly at first, then increase in slope at various points of travel as the beam moves. If left uncorrected, this error will result in true position errors that will compromise machine control accuracy. In these regions, a calculation of output voltage vs. time will quickly reveal the quality of linearity. Any errors can be immediately compensated for by the microprocessor 432. For machine automation, the ideal time for checking linearity is the "home" segment that returns the machine to it starting point. The opsistor ruler system 400, therefore, has self-calibration features that will ensure machine control accuracy every cycle even with a non uniform light source.

All zero voltage values along the opsistor ruler output represent "marker" points that are boundary lines between PiN and NiP photodiode elements. Since the distance between these points can never change, the opsistor ruler's positive and negative voltage values actually represent fractional distances away from a known marker point. This feature allows the linearity of the opsistor ruler system 400 to continually be monitored. If errors are noted (from possible light source aging), the microprocessor 432 can immediately perform corrections internally through software.

Since each 0-volt null point defines an interface between adjacent PiN and NiP photodiode elements such as photodiodes 412 and 414, the microprocessor 432 can easily calculate the linearity of motion between any two marker points. If this profile does not fit the expected linearity, corrections can be immediately made. The voltage profile sensed by the microprocessor 432 is compared against an expected straight-line response voltage profile. Voltage variations from a straight line profile will have correction values added or subtracted as required to restore position linearity by the microprocessor 432. This correction is performed each time the position measurement sensor 410 is used and permits continuous calibration on the optical ruler system 400.

In additional to autocalibration for linearity, the optical ruler system 400 can be synchronized to a "hard" machine zero at the beginning of each cycle. This feature prevents any control variations due to position offsets due to machine backlash. By synchronizing to a "hard" machine zero, the "vernier" accuracy of the opsistor ruler system 400 is maximized for every machine cycle. In operation, a "home" signal is recorded for each new measurement cycle. This home signal signifies the absolute mechanical zero of the object 402 being measured. With this input, the opsistor position measurement sensor 410 will always be matched to true machine zero. Any variation in the zero value may be corrected by an internal offset calculated by the microprocessor 432 to the output signal from the position measurement sensor 410. This feature permits set points of the object 402 (which are tied to the job being performed) to remain unchanged even when machine zero has changed. The "home" signal removes mechanical variations that may result due to machine backlash since such variations will be corrected by the internal offset.

The optical ruler system 400 derives its accuracy from absolute ratios generated by selected photodiode element pairs and is therefore not affected by power failures. Upon power return, the microprocessor 432 will scan the photodiode elements 412–424 of the opsistor measurement sensor 410, reestablish proper marker orientation and calculate the current position. When the microprocessor 432 scans the photodiode elements 412–424 only specific photodiode elements of the position measurement sensor 410 which are illuminated by the line light beam 406 will produce an output voltage. The microprocessor 432 quickly determines which adjacent photodiode elements are of interest and then interconnects the appropriate two photodiode elements via the switch array 428. Once interconnected, the photodiode elements will produce the phase voltage corresponding to the true position of the line light beam 406.

At any point along the position measurement sensor 410, the microprocessor 432 may calculate the distance corresponding to the sensor segments selected plus the phase voltage (or fractional position) to be added for true position. Even if the object 402 continues to move slightly after a power failure, the new position may be quickly recalculated upon power return. This "absolute" feature of the opsistor ruler system 400 is superior to incremental sensors that will lose position upon the loss of system power. The measurement functions thus are instantly available on the return of power.

The ratios calculated by the microprocessor 432 are the fractional positions between fixed marker points. Each marker point along the position measurement sensor 410 represents the mating line between one photodiode element pair such as photodiode elements 412 and 414. Whenever the photodiode element pair yields a zero volt signal, the centroid of the line light beam 406 will be perfectly balanced on one photodiode element pair such as photodiodes 412 and 414. With multiplex scanning by the switches 470–480 the specific photodiode pair is easily found by sensing for a positive or negative voltage output.

A light beam traversing across the position measurement sensor 410 exposing each photodiode element 412–424 can initially be processed by a lower gain for the operational amplifier 430. As the beam motion centers over a photodiode element pair, the output voltage will approach null or 0 volts. This condition represents a unique transition point in the opsistor balance and can be used to trigger a higher gain for the operational amplifier 430. A higher gain at the null at the transition point results in greater position sensitivity to the light position and thus more accurate position measurements.

Variable gain allows the opsistor ruler system 400 to become more sensitive to light position at 0-volt "null" points. As the incident impact area 502 of the line light beam 406 travels across a marker point, the opsistor voltage profile 500 in FIG. 15 can be increased for enhanced resolution. This advantage is possible because a null voltage occurs at each marker point and higher gain can be tolerated momentarily to increase spatial resolution. Increasing gain at these opsistor sensor transitions increases spatial resolution. This higher sensitivity benefits the self calibration process described above by allowing the microprocessor 432 to reference greater resolution than normally used in measurement operations. In addition, critical machine setpoints can be intentionally aligned to "null" points for increased control accuracy. An example may be the "shut height" of a stamping die for car sheet metal where travel resolution can be 0.010" during stroke motion but increases to 0.0001" at shut height closure which is calibrated to a null point between two photodiode elements.

For positional sensors, varying the amplifier gain will permit very high sensitivities around null while allowing large light displacements to be measured. The optical ruler system 400 may incorporate opsistor differential amplifiers such as those shown in FIG. 12 for the operational amplifier 430. The optical ruler system 400 thus operates with high accuracy and simplicity while requiring few components. The position measurement sensor 410 attains micron resolutions around the null points of each marker but permits large travels of 1" or more with 0.001" resolution. The six cascaded opsistor pairs (combinations of 2" pairs photodiode elements 412–424) are all that are required to produce a "vernier caliper" grade 12" optical ruler. Additional length rulers may be fabricated with a similar process of simply adding additional photodiode elements. For example, using this construction, a long 90 inch ruler for machine control can be fabricated with only 45 elements and offer 0.0005" resolution.

The position measurement sensor 410 allows spatial resolution from 0.001" to 1 micron, depending on the application. The position measurement sensor 410 has a linear position sensor function with no dead zones since a voltage change will always be present on all points of the sensor surface. A light source such as a laser light may be mounted to a moving machine member with a high degree of flexibility in orientation. The laser line light source may be positioned at various distances away from the position measurement sensor 410 without losing position accuracy. The optical ruler system 400 has built in dynamic calibration since each pass of the laser light along the photodiode elements 412–424 generates updated signal ratios that are correlated against the fixed null points of the position measurement sensor 410 by the microprocessor 432. This makes the accuracy of the position measurement sensor 410 highly immune to drift in light source intensities over time because the marker points are recalibrated constantly.

With a slight reduction in spatial accuracy, the optical ruler system 400 functions with any short term stable light source which may include almost any form of projection lamp such as simple flashlights or slit lamps. The optical ruler system 400 has excellent sensitivity to the spatial position of a light source because it is solely dependant on the centroid motion of a light beam rather than focusing on spot size and precision optics. The scan update rate of the position measurement sensor 410 is under 10 microseconds or 100,000 times per second. This high speed permits application in many rapid machine motions not serviceable by present linear position sensors. Applications may include injection rams, servo acceleration and deceleration, cutting and punching, aluminum can printing, and rotary cam machines.

An advantage in the opsistor design is that the photodiode elements 412–424 need not be perfectly aligned with respect to each another. This advantage is derived from the fact that the spatial position of each photodiode element 412–424 does not change over time. Since the position measurement sensor 410 has inherent "marker" points at the junction of each photodiode element pair, each marker point will switch across 0 volts only at one specific point due to incident beam motion. Since the fixed distance between marker points is "set in stone" during manufacturing, the processor 432 can use this fact to continually perform self-calibration under field operation.

Successive reads of the position measurement sensor 410 will also yield vector information for direction of travel, velocity and acceleration of the sensed object 402 based on the position readings correlated with time intervals. Using the optical ruler system 400 to measure velocity involves reading successive positions of the object 402 and correlating these positions with the time of such positions. Acceleration determination involves taking the times of successive velocity determinations. The optical ruler system 400 performs all functions normally found in expensive RTD linear resistive sensors but adds the features of higher speed, orientation flexibility and increased resolution.

In addition to being a sensitive position sensor, the optical ruler system 400 is also an excellent optical vibration sensor. In the normal state, the position of the line light beam 406 is fixated onto a null point and any shifts from vibration will produce a signal deviation away from the null point. This sensitivity can be well below 1 micron of motion. The use of the optical ruler system 400 as a vibration sensor capable of being stable at this sensitivity may play an important role in many surveying, alarm, and ground shift (earthquake, soil shifts, etc.) applications.

The opsistor photodiode structure in FIG. 1 may also be integrated with passive components to provide waveform-shaping functions. Such functions may be performed by multiple opsistor photodiode structures which each serve as a pixel element in an array. This property may be demonstrated in a retina stimulator unit 600 which is implanted in an eye 610 shown in FIG. 16. The usefulness of a photodiode switch structure in an artificial retinal prosthesis has been discussed in U.S. Pat. Nos. 5,016,633, issued on May 21, 1991, titled "Artificial Retina Device;" 5,024,223, issued Jun. 18, 1991, titled "Artifical Retina Device;" 5,397,350, issued Mar. 14, 1995, titled "Independent Photoelectric Artificial Retina Device and Method of Using Same;" and 5,556,423, issued Sep. 17, 1996, titled "Independent Photoelectric Artificial Retina Device and Method of Using Same" to the same inventors which are hereby incorporated by reference. In the present invention's application to retinas, passive waveform control is very important for long term retinal compatibility in order to maintain neutral voltage balance. Long term biological compatibility of cells and electrodes in saline requires a delicate balance between charge neutrality, waveform profiles and electrode compositions. This balance, or cyclic voltametric profile, must be made slightly anodic (positive) over time while active stimulations are achieved with cathodic potentials. The choice of electrode materials is also important to prevent dissolution problems which may result in rejection of artificial devices by cell structure.

The retinal stimulation unit 600 has a pixel array 602 which senses light in the form of photons. The retinal stimulation unit 600 has an electrode layer 604 which transmits the converted photons in the form of electrical waveforms. The eye 610 receives light from images on a visual axis 612 and an optic axis 614. The light comes through a cornea 616 and is directed by an iris 618 into a lens 620. The eye 610 is bounded by a sclera layer 622 which creates an inner vitreous region 624. The inner surface of the sclera layer 622 has an inner retina 626 and an outer retina 628. The retinal stimulation unit 600 is designed to restore vision in the case of damaged cells in the inner retina 626. The retinal stimulation unit 600 is implanted between the inner retina 626 and the outer retina 628 such that the pixel array 602 can receive incident photons from light on the visual axis 612 and the optic axis 614. The retinal stimulation unit 600 converts photons into electrical impulses which stimulate the inner retina 626 to produce signals which may be transmitted to an optic nerve 630.

Figure 17:
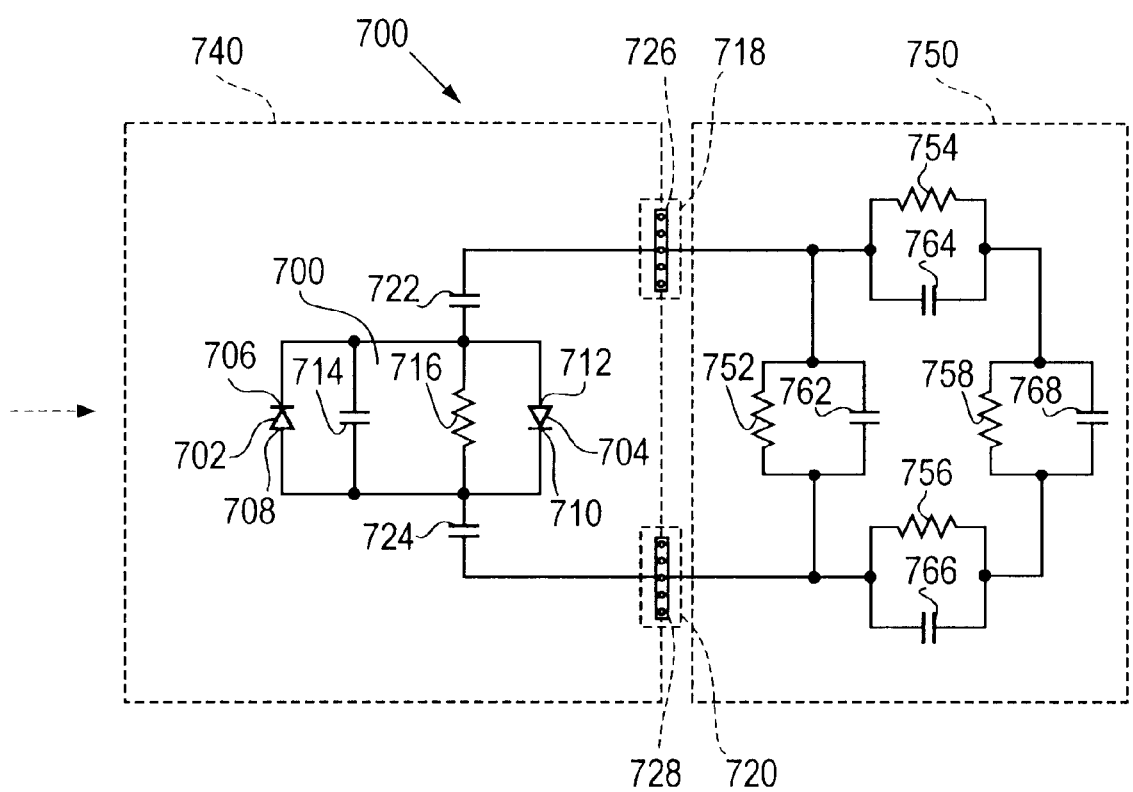
FIG. 17 is a circuit diagram of the retina stimulation unit shown in FIG. 16.

Electrically, the equivalent circuit of a passive opsistor stimulator pixel 700 of the retinal stimulator unit 600 is shown in FIG. 17. The opsistor pixel 700 is similar to the operational amplifier structure 200 shown in FIG. 12 above and will produce an electrical signal without external power requirements. By matching parasitic impedances with fabricated passive elements, the simplicity of the opsistor is preserved while achieving signal conditioning. Waveforms of the opsistor circuit can then be tailored for rise time, fall time, and signal amplitudes. All opsistor fabrication requirements are fully compatible with standard CMOS processing. A typical array 602 will be 3 mm in diameter and have over 100,000 pixel elements each similar to stimulator pixel 700.

The passive opsistor stimulator pixel 700 has two photodiodes 702 and 704 which are integrated with parallel passive elements such as resistors and capacitors for waveform shaping purposes. The photodiode 702 has a cathode 706 and an anode 708. The photodiode 704 has a cathode 710 coupled to the anode 708 of the photodiode 702. The photodiode 704 has an anode 712 coupled to the cathode 706 of the photodiode 702. The parallel passive elements in the preferred embodiment include a capacitor 714 and a resistor 716 which are both coupled between the cathodes 706 and 710 and anodes 708 and 712 of the photodiodes 702 and 704. The capacitor 714 and the resistor 716 shape the rise time, fall time and bandwidth response of the opsistor signal from an output which is a top electrode 718. A second terminal is a bottom electrode 720.

A coupling capacitor 722 is coupled to the cathode 706 of the photodiode 702 and the anode 712 of the photodiode 704. A coupling capacitor 724 is coupled to the cathode 708 of the photodiode 702 and the anode 710 of the photodiode 704. An ionic electrode capacitor 726 is coupled to the coupling capacitor 722. An ionic electrode capacitor 728 is coupled to the coupling capacitor 724. The capacitors 722, 724, 726 and 728 set the amplitude of the capacitively coupled electrical signal into an ionic system 750. The ionic system 750 represents cellular matter such as that in the inner retina 626 and is modeled by resistive/capacitive components which includes resistors 752, 754, 756, and 758, which are each in parallel with capacitors 762, 764, 766 and 768.

The passive elements such as resistor 716 and capacitor 714 are fabricated into the basic opsistor silicon structure shown in FIGS. 3–4 using standard CMOS processes. The coupling capacitors 722 and 724 are integrated into the top and bottom electrode contacts 718 and 720 of the opsistor pixel 700. The ionic electrode capacitors 726 and 728 model the electrode contacts 718 and 720 which are preferably iridium or iridium oxide electrodes in direct contact with the cell body represented by the ionic system 750. Other materials such as palladium, platinum, titanium, tantalum or combinations or oxides thereof may be used for the electrode contacts 718 and 720.

A dotted area 740 of FIG. 17 represents an electron domain where light is converted to photovoltaic potentials. Outside of the dotted area is the aqueous ion system 750. Photovoltaic potentials developed at the electrode contacts 718 and 720 electrically represented by capacitors 724 and 728 are capacitively coupled into the ionic system 750. Charge separation governed by the Helmholtz layer effect couples a voltage differential signal into cell membranes intimately in contact with the electrode contacts 718 and 720. The resistor 752 and capacitor 762 represent the shunt impedance of the cell membrane. The resistor 754 and the capacitor 764 represent the forward series impedance of the cell membrane while the resistor 756 and capacitor 766 represent the return path impedance. Finally, the resistor 758 and capacitor 768 represent the time constant of the hyperpolarization and depolarization effect. The equivalent values of all such impedances will vary based on the extent of retinal degeneration.

Figure 16:
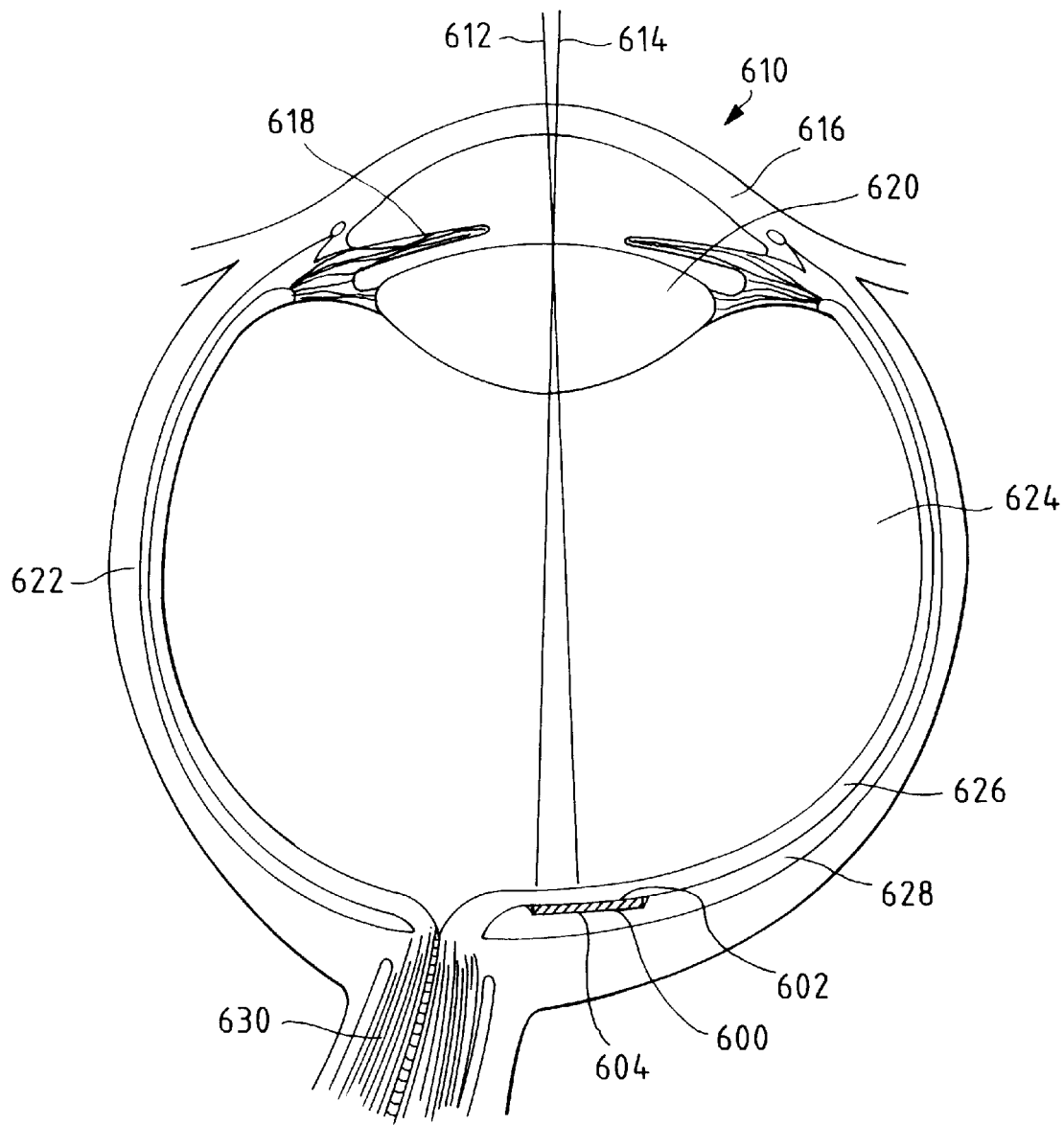
FIG. 16 is a cross-sectional view of an eye and an implanted retina stimulation unit based on the optical operational amplifier according to the present invention.

Adjusting the values of the resistor 716 and capacitor 714 set the source time constant for each opsistor pixel 700 in the array 602 of the retinal stimulator unit 600 in FIGS. 16 and 17. Typically these values are fixed during the fabrication of the substrate and components. Varying the coupling capacitors 722 and 724 will change the voltage division factor between the opsistor signal source and the final voltage fluctuation sensed by the cell impedance represented by resistor 758 and capacitor 768. Lower values of the capacitor 722 and 724 will reduce coupling efficiency to the resistor 716 and capacitor 714 resulting in more signal loss across the two source capacitors 722 and 724. The selection of capacitors 722 and 724 are also determined by the electrode chemistry used at the electrode capacitors 726 and 728.

The operation of the retinal stimulator unit 600 will be now explained with reference to FIGS. 16–17. The graded potentials normally produced in the healthy inner and outer retinas 626 and 628 are more accurately replicated by an array of opsistor pixels such as pixel 700 conditioned by passive resistive and capacitive elements such as capacitor 714 and resistor 716. With optimum resistor and capacitor values, critical electrical characteristics can be manipulated to better match the severity of retinal degeneration.

Implanted into the damaged area between the inner retina 626 and the outer retina 628, the retinal simulator unit 600 has multiple pixels such as opsistor pixel 700 which continually perform a translation function. Incident image photons are converted into electrons by the photodiode 702. The photodiode 702 thus creates a voltage potential between the electrode contacts 718 and 720. The output voltage then affects the ionic region 750 in the form of fluids and tissues of the inner retina 626 in contact with each opsistor pixel such as the pixel 700. The electrical potential from the opsistor pixel 700 alters the ionic distribution and promotes modulation of the sodium and calcium channels within surviving cell bodies in the inner retina 626. The end result is hyperpolarization (made more negative) or depolarization (made less negative) of cell bodies in contact with the retinal simulator unit 600 from the array of opsistor pixels 602.

Once hyperpolarization or depolarization is initiated by the opsistor retinal stimulator unit 600 the natural process of vision takes over. The remaining healthy cells in the inner retina 626 generate a complex pulse modulated signal that is collected by the nerve layers in the optic nerve 630 and transmitted to the brain. The opsistor retinal stimulator unit 600, therefore, serves as a signal bridge between the incoming light image and the surviving cell bodies of the degenerated inner retina 626. The present waveform shaping characteristics of the resistive and capacitive elements allow the opsistor retinal stimulator unit 600 to match the ionic characteristics of the damaged inner retina 626. The values of the resistor 716 and the capacitor 714 are selected to produce tailored electrical waveforms with rise time, fall time and voltametric balance to induce hyperpolarization and depolarization effects into the selected cell layer of the outer retina 628. Although the preferred embodiment is the use of opsistor pixels to produce an initial waveform from the detected light, the addition of waveform shaping elements such as the resistor 716 and the capacitor 714 may be coupled to the output of other photon conversion devices which produce waveforms to better tailor the waveforms' compatibility with cell matter of the inner retina 626.

It will be apparent to those skilled in the art that various modifications and variations can be made in the method and system of the present invention without departing from the spirit or scope of the invention. Thus, the present invention is not limited by the foregoing descriptions but is intended to cover all modifications and variations that come within the scope of the spirit of the invention and the claims that follow.

What is claimed is:

1. An optoelectronic operational amplifier comprising:
   a first input;
   a first photodiode with an anode and a cathode, the first photodiode optically coupled to the first input
   a second input;
   a second photodiode with an anode coupled to the cathode of the first photodiode, and an anode coupled to the cathode of the first photodiode to form an output terminal, the second photodiode optically coupled to the second input; and
   a resistor coupled in parallel with the first and second photodiodes, wherein an electrical signal is produced in proportion to an input optical signal at the first or second input at a gain level proportional to the resistor value.

2. The optoelectronic operational amplifier of claim 1 wherein the resistor is a variable resistor and the gain of the operational amplifier may be varied according to the resistor value.

3. The optoelectronic operational amplifier of claim 1 further comprising:
   an input light source emitting a light signal to the first input;
   a reference light source emitting a reference light signal to the second input; and
   wherein the input light signal is amplified in proportion to the value of the resistor and an electrical signal representative of the amplification is output at the output terminal.

4. The optoelectronic operational amplifier of claim 1 further comprising:
   an input light source emitting a light signal to the first photodiode;
   a modulator light source emitting a modulator light signal to the second photodiode; and
   wherein the input light signal is modulated by the modulator light signal and a combined signal of the input light signal and the modulator light signal is amplified in proportion to the value of the resistor and an electrical signal representative of the amplification is output at the output terminal.

5. The optoelectronic operational amplifier of claim 1 further comprising:
   an input light source emitting a modulated light signal to the first photodiode;
   a demodulator light source emitting a demodulator light signal to the second photodiode; and
   wherein the input light signal is demodulated by the demodulator light signal and a combined signal of the input light signal and the demodulator light signal is amplified in proportion to the value of the resistor and an electrical signal representative of the amplification is output at the output terminal.

6. The optoelectronic operational amplifier of claim 1 further comprising:
   an input light source emitting a light signal to the first photodiode;
   a reference light source emitting a reference light signal to the second photodiode;
   a low pass capacitor coupled in parallel to the first and second photodiodes and the resistor; and
   wherein low frequency components of the input light signal are attenuated by the low pass capacitor, the attenuation level being proportional to the value of the capacitor and input signal is amplified in proportion to the value of the resistor and output at the output terminal.

7. The optoelectronic operational amplifier of claim 1 further comprising:
   an input light source emitting a light signal to the first photodiode;
   a reference light source emitting a reference light signal to the second photodiode;
   a high pass capacitor coupled between the output terminal and the anode of the first photodiode; and
   wherein high frequency components of the input light signal are attenuated by the high pass capacitor, the attenuation level being proportional to the value of the capacitor and input signal is amplified in proportion to the value of the resistor and output at the output terminal.

8. The optoelectronic operational amplifier of claim 1 further comprising:
   an input light source emitting a light signal to the first photodiode;
   a reference light source emitting a reference light signal to the second photodiode;
   a low pass capacitor coupled in parallel to the first and second photodiodes and the resistor;
   a high pass capacitor coupled between the output terminal and the anode of the first photodiode; and
   wherein high frequency components of the input light signal are attenuated by the high pass capacitor, low frequency components of the input light signal are attenuated by the low pass capacitor the attenuation levels being proportional to the values of the capacitors and the input signal is amplified in proportion to the value of the resistor and output at the output terminal.

9. The optoelectronic operational amplifier of claim 1 further comprising:
   a first power source coupled to the first photodiode to reverse bias the first photodiode to a specific voltage level; and
   a second power source coupled to the second photodiode to reverse bias the second photodiode to a specific voltage level.

10. The optoelectronic operational amplifier of claim 1 wherein the photodiodes are fabricated on a monolithic substrate.

11. An optoelectronic operational amplifier comprising:
    a first light input;
    a first photodetector with an anode and a cathode, the first photodetector optically coupled to the first light input
    a second light input;
    a second photodetector with an anode coupled to the cathode of the first photodetector, and an anode coupled to the cathode of the first photodetector to form an output terminal, the second photodetector optically coupled to the second light input; and
    a resistor coupled in parallel with the first and second photodetector, wherein an electrical signal is produced in proportion to an input optical signal at the first or second light input at a gain level proportional to the resistor value.

12. The optoelectronic operational amplifier of claim 11 wherein the resistor is a variable resistor and the gain of the operational amplifier may be varied according to the resistor value.

13. The optoelectronic operational amplifier of claim 11 wherein the first input light signal is amplified in proportion to the value of the resistor and an electrical signal representative of the amplification is output at the output terminal.

14. The optoelectronic operational amplifier of claim 11 further comprising a modulator light source emitting a modulator light signal to the second light input and
    wherein the first light input is modulated by the modulator light signal and a combined signal of the first light input signal and the modulator light signal is amplified in proportion to the value of the resistor and an electrical signal representative of the amplification is output at the output terminal.

15. The optoelectronic operational amplifier of claim 11 further comprising:
    an input light source emitting a modulated light signal to the first light input;
    a demodulator light source emitting a demodulator light signal to the second light input; and
    wherein the input light signal is demodulated by the demodulator light signal and a combined signal of the input light signal and the demodulator light signal is amplified in proportion to the value of the resistor and an electrical signal representative of the amplification is output at the output terminal.

16. The optoelectronic operational amplifier of claim 11 further comprising:
    a low pass capacitor coupled in parallel to the first and second photodetectors and the resistor; and
    wherein low frequency components of the input light signal are attenuated by the low pass capacitor, the attenuation level being proportional to the value of the capacitor and input signal is amplified in proportion to the value of the resistor and output at the output terminal.

17. The optoelectronic operational amplifier of claim 11 further comprising:
    a high pass capacitor coupled between the output terminal and the anode of the first photodetector; and
    wherein high frequency components of the input light signal are attenuated by the high pass capacitor, the attenuation level being proportional to the value of the capacitor and input signal is amplified in proportion to the value of the resistor and output at the output terminal.

18. The optoelectronic operational amplifier of claim 11 further comprising:
   an input light source emitting a light signal to the first photodetector;
   a reference light source emitting a reference light signal to the second photodetector;
   a low pass capacitor coupled in parallel to the first and second photodetectors and the resistor;
   a high pass capacitor coupled between the output terminal and the anode of the first photodetector; and
   wherein high frequency components of the input light signal are attenuated by the high pass capacitor, low frequency components of the input light signal are attenuated by the low pass capacitor the attenuation levels being proportional to the values of the capacitors and the input signal is amplified in proportion to the value of the resistor and output at the output terminal.

19. The optoelectronic operational amplifier of claim 11 further comprising:
   a first power source coupled to the first photodetector to reverse bias the first photodetector to a specific voltage level; and
   a second power source coupled to the second photodetector to reverse bias the second photodetector to a specific voltage level.

20. The optoelectronic operational amplifier of claim 11 wherein the photodetectors are photodiodes.

21. The switch of claim 20 wherein the photodiodes are fabricated on a monolithic substrate.

* * * * *